US006787289B2

United States Patent
Yamada et al.

(10) Patent No.: US 6,787,289 B2
(45) Date of Patent: Sep. 7, 2004

(54) RADIATION SENSITIVE REFRACTIVE INDEX CHANGING COMPOSITION AND REFRACTIVE INDEX CHANGING METHOD

(75) Inventors: Kenji Yamada, Kyoto (JP); Nobuo Bessho, Tokyo (JP); Atsushi Kumano, Tokyo (JP); Keiji Konno, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/322,460

(22) Filed: Dec. 19, 2002

(65) Prior Publication Data

US 2003/0139486 A1 Jul. 24, 2003

(30) Foreign Application Priority Data

Dec. 21, 2001 (JP) ....................................... 2001-389777

(51) Int. Cl.[7] .......................... G03C 1/73; G03F 7/028; G03F 7/032; G03F 7/035; G03F 7/037; G03F 7/20
(52) U.S. Cl. .................... 430/281.1; 430/916; 430/907; 430/905; 430/906; 430/908; 430/909; 430/910; 430/325; 430/326; 430/321; 430/270.1; 430/285.1; 430/280.1
(58) Field of Search ............................ 430/281.1, 916, 430/907, 905, 906, 908, 909, 910, 325, 326, 321, 270.1, 285.1, 280.1

(56) References Cited

U.S. PATENT DOCUMENTS

| 5,627,010 A | 5/1997 | Pai et al. | |
| 5,763,514 A | 6/1998 | Koike et al. | ................ 525/265 |
| 5,998,096 A * | 12/1999 | Umemoto et al. | ....... 430/281.1 |
| 6,291,561 B1 * | 9/2001 | Breyne et al. | ................ 524/96 |

FOREIGN PATENT DOCUMENTS

| FR | 863 142 | 3/1941 |
| JP | 57-040526 | 3/1982 |
| JP | 58-069217 | 4/1983 |
| JP | 62-025705 | 2/1987 |
| JP | 03-192310 | 8/1991 |
| JP | 04-330444 | 11/1992 |
| JP | 05-060931 | 3/1993 |
| JP | 07-056026 | 3/1995 |
| JP | 07-092313 | 4/1995 |
| JP | 08-336911 | 12/1996 |
| JP | 08-337609 | 12/1996 |
| JP | 09-133813 | 5/1997 |
| JP | 09-178901 | 7/1997 |
| WO | WO 93/19505 | 9/1993 |
| WO | WO 94/04949 | 3/1994 |

* cited by examiner

*Primary Examiner*—Mark F. Huff
*Assistant Examiner*—Sin J. Lee
(74) *Attorney, Agent, or Firm*—Oblon, Spivak, McClelland, Maier & Neustadt, P.C.

(57) ABSTRACT

A radiation sensitive refractive index changing composition whose refractive index of a material is changed by a simple method, whose changed refractive index difference is sufficiently large, and which can provide a stable refractive index pattern and a stable optical material regardless of their use conditions.

The radiation sensitive refractive index changing composition comprises (A) a polymerizable compound, (B) a non-polymerizable compound having a lower refractive index than the polymer of the polymerizable compound (A), and (C) a radiation sensitive polymerization initiator.

19 Claims, No Drawings

RADIATION SENSITIVE REFRACTIVE INDEX CHANGING COMPOSITION AND REFRACTIVE INDEX CHANGING METHOD

FIELD OF THE INVENTION

The present invention relates to a radiation sensitive refractive index changing composition, a method of forming a refractive index pattern, a refractive index pattern and an optical material. More specifically, it relates to a novel radiation sensitive refractive index changing composition which is used in photoelectronic and display fields, a method of forming a refractive index pattern, a refractive index pattern and an optical material.

DESCRIPTION OF THE PRIOR ART

In the current society called "multi-media society", refractive index distribution type optically molded products each consisting of different refractive index regions are in great demand. The products include not only optical fibers for transmitting information but also optical diffraction gratings having a periodical change in refractive index, optical memories in which information is written at sites having different refractive indices, optically coupled elements such as optical IC's having a fine refractive index pattern, optical control elements, optical modulation elements and optical transmission elements.

The refractive index distribution type optically molded products are divided into two types: one having a continuous refractive index distribution, such as GI type optical fibers in the molded products (to be referred to as "GRIN optically molded products" hereinafter) and the other having a discontinuous refractive index distribution, such as optical diffraction gratings and SI type optical waveguides.

The GRIN optically molded products are attracting much attention as the next-generation optically molded products. For example, a GI type optical fiber whose refractive index is reduced from the center axis of the core of the optical fiber to the periphery in a parabolic form can transmit a great volume of information. A GRIN lens whose refractive index continuously changes therein is used as a reading lens for use in copiers, spherical lens for connecting fibers, or micro-lens, making use of its characteristic features that it has refractive power even on a flat surface and that it is free from spherical aberration.

A large number of methods of producing the above GRIN optically molded products have been proposed up till now. For example, JP-A 9-133813, JP-A 8-336911, JP-A 8-337609, JP-A 3-192310, JP-A 5-60931 (the term "JP-A" as used herein means an "unexamined published Japanese patent application"), WO93/19505 and WO94/04949 disclose a method of obtaining a GI type optical fiber by dispersing a low-molecular weight compound or a monomer into a polymer and continuously distributing its concentration. JP-A 62-25705 discloses that a rod-like GI type optically molded product or optical fiber is obtained by photocopolymerizing two or more vinyl monomers having different refractive indices and reactivity ratios. Further, JP-A 7-56026 discloses a method of obtaining a refractive index distribution by forming a polymer A having a photoreactive functional group, dispersing a compound B having a lower refractive index than the polymer A into the polymer A to form the concentration distribution of the compound B and photo-reacting the polymer A with the compound B.

Some methods of producing GRIN optically molded products of an inorganic material have also been proposed. One of them is, for example, a method of producing a GI type rod by adding high refractive index thallium to rod-like glass essentially composed of silicon or lead, immersing the glass in a molten solution containing low refractive index potassium, and forming a potassium concentration distribution through ion exchange.

A GRIN lens can be obtained likewise by applying the above method to a short rod, that is, a lens-like optically molded product. Alternatively, the GI type rod produced by the above method may be sliced.

As one of the above methods of producing optically molded products having a fine refractive index pattern, such as an optical diffraction grating and optical IC, there is known a technology for obtaining a change in refractive index by causing a photochemical reaction in a molded product through exposure to light. For instance, in the case of an inorganic material, glass doped with germanium is exposed to light to change its refractive index so as to produce an optical diffraction grating. In the case of an organic material, the above technology is known as a photochromic reaction or photobleaching. JP-A 7-92313 discloses a technology for obtaining an optical diffraction grating by causing a change in the refractive index of a material containing a low-molecular weight compound having photochemical reactivity dispersed in a polymer through exposure to a laser beam. Further, JP-A 9-178901 has recently proposed the application of this technology to the production of a GRIN optically molded product. This method provides a continuous refractive index distribution in a depth direction with respect to irradiation, making use of the fact that light projected onto a molded product is absorbed and weakened in intensity.

However, in the refractive index distributions obtained with the above conventional materials, the maximum refractive index difference is only about 0.001 to 0.02 and it is difficult to provide a wider refractive index distribution for the purpose of preventing an optical loss and suppressing the malfunction of a circuit.

When the above conventional materials are used under the condition that light having a wavelength close to the wavelength used for changing the refractive index passes therethrough after a refractive index distribution is formed, it is impossible to prevent a phenomenon that a gradual change in refractive index occurs, thereby deteriorating the materials.

SUMMARY OF THE INVENTION

The present invention has been made in view of the above situation of the prior art.

That is, it is an object of the present invention to provide a radiation sensitive refractive index changing composition whose refractive index of a material is changed by a simple method, whose changed refractive index difference is sufficiently large, and which can provide a stable refractive index pattern and a stable optical material regardless of their use conditions.

It is another object of the present invention to provide a method of forming a refractive index pattern from the above composition of the present invention.

It is still another object of the present invention to provide a refractive index pattern or an optical material produced by the above method of the present invention.

Other objects and advantages of the present invention will become apparent from the following description.

According to the present invention, firstly, the above objects and advantages of the present invention are attained by a radiation sensitive refractive index changing composition which comprises (A) a polymerizable compound, (B) a non-polymerizable compound having a lower refractive index than the polymer of the polymerizable compound (A), and (C) a radiation sensitive polymerization initiator.

Secondly, the above objects and advantages of the present invention are attained by a method of forming a refractive index pattern by exposing a radiation sensitive refractive index changing composition comprising (A) a polymerizable compound, (B) a non-polymerizable compound having a lower refractive index than the polymer of the polymerizable compound (A), and (C) a radiation sensitive polymerization initiator to radiation through a pattern mask.

Thirdly, the above objects and advantages of the present invention are attained by a refractive index pattern formed by the above refractive index pattern forming method.

In the fourth place, the above objects and advantages of the present invention are attained by an optical material formed by the above refractive index pattern forming method.

In the present invention, the term "refractive index pattern" means a refractive index distribution type material formed in regions having different refractive indices. Comparison of the value of refractive indices is performed based on the refractive indices measured at room temperature and a wavelength of 633 nm.

Preferred Embodiments of the Invention

A detailed description is subsequently given of each component of a refractive index changing material used in the refractive index pattern forming method of the present invention.

(A) Polymerizable Compound

Any known compound which is polymerized or reacted with an acid, base or radical can be used as the polymerizable compound (A) used in the present invention. The refractive index of its polymer is preferably 1.45 to 1.9, more preferably 1.5 to 1.9. Although the polymerizable compound used as the component (A) is generally a monomer, its molecular weight is not particularly limited and it may have a molecular weight as high as an oligomer. A compound which has two or more polymerizable functional groups such as double bonds in the molecule may also be preferably used.

The compound which is polymerized or reacted with an acid, base or radical produced from a radiation sensitive decomposer is a compound having a polymerizable functional group such as vinyl group, ethylenimine group, epoxy group, episulfide group, hydroxyl group or oxetanyl group in the molecule.

Examples of the above compound include vinyl aromatic compounds, vinyl ether compounds, acrylic acids and methacrylic acids, ring-open polymerizable monomers having an epoxy group, oxetane compounds and maleimides. Typical examples of the above compounds are given below.

Typical examples of the vinyl aromatic compounds include, styrene, and styrene derivatives which are substituted by alkyl, alkoxyl, halogen, haloalkyl, nitro, cyano, amide, ester groups and/or halogen group in the α-, o-, m-, and/or p-position; monovinyl aromatic compounds such as styrenesulfonic acid, 2,4-dimethylstyrene, para-dimethylaminostyrene, vinylbenzyl chloride, vinylbenzaldehyde, indene, 1-methylindene, acenaphthalene, vinylnaphthalene, vinylanthracene, vinylcarbazole and 2-vinylfluorene; polyfunctional vinyl aromatic compounds such as o-, m- and p-divinylbenzenes, o-, m- and p-diisopropenylbenzenes, 1,2,4-trivinylbenzene, 1,2-vinyl-3,4-dimethylbenzene, 1,3-divinylnaphthalene, 1,3,5-trivinylnaphthalene, 2,4-divinylbiphenyl, 3,5,4'-trivinylbiphenyl, 1,2-divinyl-3,4-dimethylbenzene and 1,5,6-trivinyl-3,7-diethylnaphthalene. There are o-, m- and p-isomers of divinylbenzene and diisopropenylbenzene, and divinylbenzene and diisopropenylbenzene may be mixtures of these isomers.

Typical examples of the vinyl ether compounds include monoalkyl vinyl ethers such as methyl vinyl ether, ethyl vinyl ether, n-propyl vinyl ether, n-butyl vinyl ether, tert-butyl vinyl ether, isobutyl vinyl ether, tert-amyl vinyl ether, dodecyl vinyl ether, octadecyl vinyl ether, ethylene glycol butyl vinyl ether, triethylene glycol ethyl vinyl ether, 2-chloroethyl vinyl ether, 2-ethylhexyl vinyl ether, cyclohexyl vinyl ether, aminopropyl vinyl ether and 2-(diethylamino)ethyl vinyl ether; monoaryl vinyl ethers such as benzyl vinyl ether, phenyl vinyl ether, para-tolyl vinyl ether and naphthyl vinyl ether; divinyl ethers such as butane-1,4-diol divinyl ether, hexane-1,6-diol divinyl ether, 1,4-cyclohexanedimethanol divinyl ether, di(4-vinyloxy)butyl isophthalate, di(4-vinyloxy)butyl terephthalate, di(4-vinyloxy)butyl glutarate, di(4-vinyloxy)butyl succinate, ethylene glycol divinyl ether, diethylene glycol divinyl ether and triethylene glycol divinyl ether; trivinyl ethers such as trimethylolpropane trivinyl ether; tetravinyl ethers such as pentaerythritol tetravinyl ether; and hydroxyl group-containing vinyl ethers such as butanediol monovinyl ether, ethylene glycol monovinyl ether, diethylene glycol monovinyl ether, cyclohexanedimethanol monovinyl ether and hexanediol monovinyl ether.

Typical examples of the methacrylic acid and acrylic acid compounds include methacrylic acid, acrylic acid, and esters such as methyl, ethyl, n-propyl, i-propyl, n-butyl, sec-butyl, tert-butyl, pentyl, neopentyl, isoamylhexyl, cyclohexyl, adamantyl, allyl, propargyl, phenyl, naphthyl, anthracenyl, anthraquinonyl, piperonyl, salicyl, cyclohexyl, benzyl, phenethyl, cresyl, glycidyl, 1,1,1-trifluoroethyl, perfluoroethyl, perfluoro-n-propyl, perfluoro-i-propyl, triphenylmethyl, tricyclo[5.2.1.0$^{2,6}$]decane-8-yl (called "dicyclopentanyl" in this technical field), cumyl, 3-(N,N-dimethylamino)propyl, 3-(N,N-dimethylamino)ethyl, furyl and furfuryl of methacrylic acid and acrylic acid; anilides and amides of methacrylic or acrylic acid such as amide, N,N-dimethyl, N,N-diethyl, N,N-dipropyl, N,N-diisopropyl and anthranyl of methacrylic acid and acrylic acid; polyfunctional (meth)acrylates such as ethylene glycol di(meth) acrylate, diethylene glycol di(meth)acrylate, propanediol di(meth)acrylate, butanediol di(meth)acrylate, hexanediol di(meth)acrylate, trimethylolpropane di(meth)acrylate, trimethylolpropane tri(meth)acrylate, pentaerythritol tri(meth) acrylate, pentaerythritol tetra(meth)acrylate, (meth) acryloyloxyethyl sulfide, 1,4-bis[(meth) acryloylthioethylthiomethyl]benzene, di(meth)acrylates of compounds obtained by adding ethylene oxide or propylene oxide to both terminals of hydroquinone or bisphenol, 2,2-bis(4-(methacryloxyethoxy)phenyl)propane, 2-acryloyloxyethyl-2-hydroxypropyl phthalate, bis(4-methacryloylthiophenyl)sulfide, p-bis(2-methacryloyloxyethylthio)xylylene and p-bis(2-methacryloyloxypropylthio)xylylene.

Typical examples of the ring-open polymerizable monomers having an epoxy group include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 3,4-epoxycyclohexylmethyl-3, 4-epoxycyclohexane carboxylate, 2-(3,4-epoxycyclohexyl-5,5-spiro-3,4-epoxy)cyclohexane-metha-dioxane, bis(3,4-epoxycyclohexylmethyl)adipate, vinylcyclohexene oxide, 4-vinylepoxycyclohexane, bis(3,4-epoxy-6-methylcyclohexylmethyl)adipate, 3,4-epoxy-6-methylcyclohexyl-3,4-epoxy-6-methylcyclohexane carboxylate, methylenebis(3,4-epoxycyclohexane), dicyclopentadiene diepoxide, ethylene glycol di(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ether, polyglycidyl ethers of a polyether polyol obtained by adding one or more alkylene oxides to an aliphatic polyhydric alcohol such as ethylene glycol, propylene glycol or glycerin, diglycidyl esters of an aliphatic long-chain dibasic acid, monoglycidyl ethers of an aliphatic higher alcohol, and monoglycidyl ethers of phenol, cresol, butyl phenol or polyether alcohols obtained by adding alkylene oxide to these alcohols. Further, thioepoxy compounds obtained by substituting the oxygen atom of the epoxy ring of each of the above compounds with a sulfur atom may also be used.

Typical examples of the oxetane compounds include 3-ethyl-3-methoxymethyloxetane, 3-ethyl-3-ethoxymethyloxetane, 3-ethyl-3-butoxymethyloxetane, 3-ethyl-3-hexyloxymethyloxetane, 3-methyl-3-hydroxymethyloxetane, 3-ethyl-3-hydroxymethyloxetane, 3-ethyl-3-allyloxymethyloxetane, 3-ethyl-3-(2'-hydroxyethyl)oxymethyloxetane, 3-ethyl-3-(2'-hydroxy-3'-phenoxypropyl)oxymethyloxetane, 3-ethyl-3-(2'-hydroxy-3'-butoxypropyl)oxymethyloxetane, 3-ethyl-3-[2'-(2''-ethoxyethyl)oxymethyl]oxetane, 3-ethyl-3-(2'-butoxyethyl)oxymethyloxetane, 3-ethyl-3-benzyloxymethyloxetane and 3-ethyl-3-(p-tert-butylbenzyloxymethyl)oxetane.

Compounds having both an oxetanyl group and a polymerizable vinyl group in the molecule, such as 3-((meth)acryloyloxymethyl)oxetane, 3-((meth)acryloyloxymethyl)-2-trifluoromethyloxetane, 3-((meth)acryloyloxymethyl)-2-phenyloxetane, 2-((meth)acryloyloxymethyl)oxetane and 2-((meth)acryloyloxymethyl)oxetane and 2-((meth)acryloyloxymethyl)-4-trifluoromethyloxetane may also be preferably used.

Typical examples of the maleimide-based monomers include N-phenylmaleimide, N-cyclohexylmaleimide, N-benzylmaleimide, N-succinimidyl-3-maleimide benzoate, N-succinimidyl-4-maleimide butyrate, N-succinimidyl-6-maleimide caproate, N-succinimidyl-3-maleimide propionate and N-(9-acridinyl)maleimide.

Acrylonitrile, acrolein, methacrylonitrile, vinyl chloride, vinylidene chloride, vinyl fluoride, vinylidene fluoride, N-vinylpyrrolidone, vinylpyridine and vinyl acetate may also be used.

The hydrogen atom contained in all the above compounds enumerated as the component (A) may be substituted by a chlorine atom, bromine atom, hydroxyl group, mercapto group, alkoxy group, thioalkyl group, haloalkyl group, haloalkoxy group, halothioalkyl group, alkylthioester group, mercaptoalkyl group, aryl group, aralkyl group or cyano group.

The above alkoxyl group may be linear or branched. Examples of the alkoxyl group include methoxy group, ethoxy group, n-propoxy group, i-propoxy group, n-butoxy group, i-butoxy group, sec-butoxy group, t-butoxy group, n-pentyloxy group, neopentyloxy group and n-hexyloxy group.

The above alkylthio group may be linear or branched. Examples of the alkylthio group include methylthio group, ethylthio group, n-propylthio group, i-propylthio group, n-butylthio group, i-butylthio group, sec-butylthio group, t-butylthio group, n-pentylthio group, neopentylthio group and n-hexylthio group.

Examples of the above haloalkyl group include trifluoromethyl group, pentafluoroethyl group, heptafluoropropyl group, chloromethyl group, 2-chloroethyl group, 3-chloropropyl group, 1-chloromethylethyl group, 4-chlorobutyl group, 2-chloromethylpropyl group, 5-chloropentyl group, 3-chloromethylbutyl group, 2-chloroethylpropyl group, 6-chlorohexyl group, 3-chloromethylpentyl group, 4-chloromethylpentyl group, 2-chloroethylbutyl group, bromomethyl group, 2-bromoethyl group, 3-bromopropyl group, 1-bromomethylethyl group, 4-bromobutyl group, 2-bromomethylpropyl group, 5-bromopentyl group, 3-bromomethylbutyl group, 2-bromoethylpropyl group, 6-bromohexyl group, 3-bromomethylpentyl group, 4-bromomethylpentyl group and 2-bromoethylbutyl group.

Examples of the above haloalkoxyl group include trifluoromethoxy group, pentafluoroethoxy group, heptafluoropropoxy group, chloromethoxy group, 2-chloroethoxy group, 3-chloropropoxy group, 1-chloromethylethoxy group, 4-chlorobutoxy group, 2-chloromethylpropoxy group, 5-chloropentyloxy group, 3-chloromethylbutoxy group, 2-chloroethylpropoxy group, 6-chlorohexyloxy group, 3-chloromethylpentyloxy group, 4-chloromethylpentyloxy group, 2-chloroethylbutoxy group, bromomethoxy group, 2-bromoethoxy group, 3-bromopropoxy group, 1-bromomethylethoxy group, 4-bromobutoxy group, 2-bromomethylpropoxy group, 5-bromopentyloxy group, 3-bromomethylbutoxy group, 2-bromoethylpropoxy group, 6-bromohexyloxy group, 3-bromomethylpentyloxy group, 4-bromomethylpentyloxy group and 2-bromoethylbutoxy group.

Examples of the above haloalkylthio group include trifluoromethylthio group, pentafluoroethylthio group, heptafluoropropylthio group, chloromethylthio group, 2-chloroethylthio group, 3-chloropropylthio group, 1-chloromethylethylthio group, 4-chlorobutylthio group, 2-chloromethylpropylthio group, 5-chloropentylthio group, 3-chloromethylbutylthio group, 2-chloroethylpropylthio group, 6-chlorohexylthio group, 3-chloromethylpentylthio group, 4-chloromethylpentylthio group, 2-chloroethylbutylthio group, bromomethylthio group, 2-bromoethylthio group, 3-bromopropylthio group, 1-bromomethylethylthio group, 4-bromobutylthio group, 2-bromomethylpropylthio group, 5-bromopentylthio group, 3-bromomethylbutylthio group, 2-bromoethylpropylthio group, 6-bromohexylthio group, 3-bromomethylpentylthio group, 4-bromomethylpentylthio group and 2-bromoethylbutylthio group.

Examples of the above mercaptoalkyl group include mercaptomethyl group, 2-mercaptoethyl group, 3-mercaptopropyl group, 1-mercaptomethylethyl group, 4-mercaptobutyl group, 2-mercaptomethylpropyl group, 5-meracptopentyl group, 3-mercaptomethylbutyl group, 2-mercaptoethylpropyl group, 6-mercaptohexyl group, 3-mercaptomethylpentyl group, 4-mercaptomethylpentyl group and 2-mercaptoethylbutyl group.

Examples of the above aryl group include phenyl group, tolyl group, xylyl group, cumenyl group and 1-naphthyl group.

Examples of the above aralkyl group include benzyl group, α-methylbenzyl group, phenethyl group and naphthylmethyl group.

Known compounds listed above may be used as the polymerizable compound (A) in the present invention without restriction. A compound having an aromatic ring, halogen atom or sulfur atom may be advantageously used to increase the difference in refractive index between it and the component (B).

A polymerizable oligomer compound may also be used as the polymerizable compound (A) in the present invention.

The above reactive oligomer compound is selected from a polymerizable oligomer compound having an ethylenically unsaturated bond, epoxy oligomer compound, thiirane oligomer compound, oxetane oligomer compound, alkoxymethyl melamine compound, alkoxymethyl glycoluril compound, alkoxymethyl benzoguanamine compound, alkoxymethyl urea compound, isocyanate compound, cyanate compound, oxazoline compound, oxazine compound and silyl compound (halogenated silyl compound or other silyl compound).

The above polymerizable oligomer compound having an ethylenically unsaturated bond is preferably a monofunctional or bifunctional (meth)acrylate or (meth)acrylate having a functionality of 3 or more, particularly preferably bifunctional (meth)acrylate or (meth)acrylate having a functionality of 3 or more, from the viewpoints of polymerizability and the strength of the obtained cured film.

Examples of the above monofunctional (meth)acrylate include 2-hydroxyethyl (meth)acrylate, carbitol (meth)acrylate, isobornyl (meth)acrylate, 3-methoxybutyl (meth)acrylate and 2-(meth)acryloyloxyethyl-2-hydroxypropyl phthalate. Commercially available products of the above monofunctional (meth)acrylate include Aronix M-101, M-111 and M-114 (of Toagosei Chemical Industry Co., Ltd.), KAYARAD TC-110S and TS-120S (of Nippon Kayaku Co., Ltd.) and Biscoat 158 and 2311 (of Osaka Yuki Kagaku Kogyo Co., Ltd.).

Examples of the above bifunctional (meth)acrylate include ethylene glycol (meth)acrylate, 1,6-hexanediol di(meth)acrylate, 1,9-nonanediol di(meth)acrylate, polypropylene glycol di(meth)acrylate, tetraethylene glycol di(meth)acrylate, bisphenoxyethanolfluorene diacrylate, 2,2-bis(4-((meth)acryloxyethoxy)phenyl)propane, 2-(meth)acryloyloxyethyl-2-hydroxypropyl phthalate, bis(4-(meth)acryloylthiophenyl)sulfide, p-bis(2-(meth)acryloyloxyethylthio)xylylene and p-bis(2(meth)acryloyloxypropylthio)xylylene. Commercially available products of the above bifunctional (meth)acrylate include Aronix M-210, M-240 and M-6200 (of Toagosei Chemical Industry Co., Ltd.), KAYARAD HDDA, HX-220 and R-604 (of Nippon Kayaku Co., Ltd.) and Biscoat 260, 312 and 335HP (of Osaka Yuki Kagaku Kogyo Co., Ltd.).

Examples of the above (meth)acrylate having a functionality of 3 or more include trimethylolpropane tri(meth)acrylate, pentaerythritol tri(meth)acrylate, tri((meth)acryloyloxyethyl)phosphate, pentaerythritol tetra(meth)acrylate, dipentaerythritol penta(meth)acrylate and dipentaerythritol hexa(meth)acrylate. Commercially available products of the above (meth)acrylate having a functionality of 3 or more include Aronix M-309, M-400, M-402, M-405, M-450, M-7100, M-8030, M-8060, M-1310, M-1600, M-1960, M-8100, M-8530, M-8560 and M-9050 (of Toagosei Chemical Industry Co., Ltd.), KAYARAD TMPTA, DPHA, DPCA-20, DPCA-30, DPCA-60 and DPCA-120 (of Nippon Kayaku Co., Ltd.), and Biscoat 295, 300, 360, GPT, 3PA and 400 (of Osaka Yuki Kagaku Kogyo Co., Ltd.).

Further, urethane acrylates, urethane adducts and polyester acrylates may be advantageously used as the polymerizable compound having an ethylenically unsaturated bond in the present invention, besides the above (meth)acrylate compounds. Commercially available products of these polymerizable compounds having an ethylenically unsaturated bond include Aronix M-7100, M-8030, M-8060, M-1310, M-1600, M-1960, M-8100, M-8530, M-8560 and M-9050 (of Toagosei Chemical Industry Co., Ltd.).

The above monofunctional and bifunctional (meth)acrylates, (meth)acrylates having a functionality of 3 or more, urethane acrylates, urethane adducts and polyester acrylates may be used alone or in combination.

Examples of the above epoxy oligomer compound include bisphenol A epoxy resin, bisphenol F epoxy resin, phenol novolak epoxy resin, cresol novolak epoxy resin, cyclic aliphatic epoxy resin, bisphenol A epoxy compound and aliphatic polyglycidyl ether.

Examples of commercially available products of the above compounds are given below. Commercially available products of the bisphenol A epoxy resin include Epicoat 1001, 1002, 1003, 1004, 1007, 1009, 1010 and 828 (of Yuka Shell Epoxy Co., Ltd.), those of the bisphenol F epoxy resin include Epicoat 807 (of Yuka Shell Epoxy Co., Ltd.), those of the phenol novolak epoxy resin include Epicoat 152 and 154 (of Yuka Shell Epoxy Co., Ltd.) and EPPN201 and 202 (of Nippon Kayaku Co., Ltd.), those of the cresol novolak epoxy resin include EOCN-102, EOCN-103S, EOCN-104S, EOCN-1020, EOCN-1025 and EOCN-1027 (of Nippon Kayaku Co., Ltd.) and Epicoat 180S75 (of Yuka Shell Epoxy Co., Ltd.), those of the cyclic aliphatic epoxy resin include CY175, CY177 and CY179 (of CIBA-GEIGY A.G.), ERL-4234, ERL-4299, ERL-4221 and ERL-4206 (of U.C.C. Co., Ltd.), Showdyne 509 (of Showa Denko K.K.), Araldyte CY-182, CY-192 and CY-184 (of CIBA-GEIGY A.G.), Epichlon 200 and 400 (of Dainippon Ink and Chemicals, Inc.), Epicoat 871 and 872 (of Yuka Shell Epoxy Co., Ltd.) and ED-5661 and ED-5662 (of Celanees Coating Co., Ltd.), and those of the aliphatic polyglycidyl ether include Epolite 100MF (of Kyoeisha Kagaku Co., Ltd.) and Epiol TMP (of NOF Corporation).

Besides the above compounds, sulfur-containing epoxy compounds such as bis(β-epoxypropyl)sulfide, bis(β-epoxypropylthio)methane, 1,2-bis(β-epoxypropylthio)ethane, 1,3-bis(β-epoxypropylthio)propane, 1,2-bis(β-epoxypropylthio)propane, 1-(β-epoxypropylthio)-2-(β-epoxypropylthiomethyl)propane, 1,4-bis(β-epoxypropylthio)butane, 1,3-bis(β-epoxypropylthio)butane, 1-(β-epoxypropylthio)-3-(β-epoxypropylthiomethyl)butane, 1,5-bis(β-epoxypropylthio)pentane, 1-(β-epoxypropylthio)-4-(β-epoxypropylthiomethyl)pentane, 1,6-bis(β-epoxypropylthio)hexane, 1-(β-epoxypropylthio)-5-(β-epoxypropylthiomethyl)hexane, 1-(β-epoxypropylthio)-2-[(2-β-epoxypropylthioethyl)thiol]ethane, 1-(β-epoxypropylthio)-2-[(2-(2-β-epoxypropylthioethyl)thioethyl)thio]ethane, tetrakis(β-epoxypropylthiomethyl)methane, 1,1,1-tris(β-epoxypropylthiomethyl)propane, 1,5-bis(β- epoxypropylthio)-2-(β-epoxypropylthiomethyl)-3-thiapentane, 1,5-bis(β-epoxypropylthio)-2,4-bis(β-epoxypropylthiomethyl)-3-thiapentane, 1-(β-epoxypropylthio)-2,2-bis(β-epoxypropylthiomethyl)-4-thiahexane, 1,5,6-tris(β-epoxypropylthio)-4-(β-epoxypropylthiomethyl)-3-thiahexane, 1,3- and 1,4-bis(β-epoxypropylthio)cyclohexanes, 1,3- and 1,4-bis(β-epoxypropylthiomethyl)cyclohexanes, bis[4-(β-epoxypropylthio)cyclohexyl]methane, 2,2-bis[4-(β-epoxypropylthio)cyclohexyl]propane, bis[4-(β-epoxypropylthio)cyclohexyl]sulfide, 2,5-bis(β-epoxypropylthiomethyl)-1,4-dithian, 2,5-bis(β-epoxypropylthioethylthiomethyl)-1,4-dithian, 1,3- and 1,4-bis(β-epoxypropylthio)benzenes, 1,3- and 1,4-bis(β-epoxypropylthiomethyl)benzenes, bis[4-(β-epoxypropylthio)phenyl]methane, 2,2-bis[4-(β-epoxypropylthio)phenyl]propane, bis[4-(β-epoxypropylthio)phenyl]sulfide, bis[4-(β-epoxypropylthio)phenyl]sulfone and 4,4'-bis(β-epoxypropylthio)biphenyl; and epoxy oligomer compounds such as phenyl glycidyl ether, butyl glycidyl ether, 3,3,3-trifluoromethylpropylene oxide, styrene oxide, hexafluoropropylene oxide, cyclohexene oxide, N-glycidylphthalimide, (nonafluoro-N-butyl) epoxide, perfluoroethylglycidyl ether, epichlorohydrin, epibromohydrin, N,N-diglycidyl aniline and 3-[2-(perfluorohexyl)ethoxy]-1,2-epoxypropane may also be preferably used.

Examples of the above thiirane compound include those obtained by substituting the epoxy groups of the above epoxy oligomer compounds with an ethylene sulfide group as shown in J. Org. Chem., 28, 229 (1963), for example.

Examples of the above oxetane oligomer compound include bis[(3-ethyl-3-oxetanylmethoxy)methyl]benzene (trade name: XDO, manufactured by Toagosei Chemical Industry Co., Ltd.), bis[(3-ethyl-3-oxetanylmethoxy) methyl-phenyl]methane, bis[(3-ethyl-3-oxetanylmethoxy) methyl-phenyl]ether, bis[(3-ethyl-3-oxetanylmethoxy) methyl-phenyl]propane, bis[(3-ethyl-3-oxetanylmethoxy) methyl-phenyl]sulfone, bis[(3-ethyl-3-oxetanylmethoxy) methyl-phenyl]ketone, bis[(3-ethyl-3-oxetanylmethoxy) methyl-phenyl]hexafluoropropane, tri[(3-ethyl-3-oxetanylmethoxy)methyl]benzene and tetra[(3-ethyl-3-oxetanylmethoxy)methyl]benzene.

The above alkoxymethyl melamine compound, alkoxymethyl benzoguanamine compound, alkoxymethyl glycoluril compound and alkoxymethyl urea compound are obtained by substituting the methylol groups of a methylol melamine compound, methylol benzoguanamine compound, methylol glycoluril compound and methylol urea compound with an alkoxymethyl group, respectively. The type of the alkoxymethyl group is not particularly limited, as exemplified by methoxymethyl group, ethoxymethyl group, propoxymethyl group and butoxymethyl group.

Commercially available products of the above compounds include Cymel 300, 301, 303, 370, 325, 327, 701, 266, 267, 238, 1141, 272, 202, 1156, 1158, 1123, 1170 and 1174, and UFR65 and 300 (of Mitsui Cyanamid Co., Ltd.), and Nikalac Mx-750, Mx-032, Mx-706, Mx-708, Mx-40, Mx-31, Ms-11 and Mw-30 (of Sanwa Chemical Co., Ltd.).

Examples of the above isocyanate compound include phenylene-1,3-diisocyanate, phenylene-1,4-diisocyanate, 1-methoxyphenylene-2,4-diisocyanate, 1-methylphenylene-2,4-diisocyanate, 2,4-tolylene diisocyanate, 2,6-tolylene diisocyanate, 1,3-xylylene diisocyanate, 1,4-xylylene diisocyanate, biphenylene-4,4'-diisocyanate, 3,3'-dimethoxybiphenylene-4,4'-diisocyanate, 3,3'-dimethylbiphenylene-4,4'-diisocyanate, diphenylmethane-2, 4'-diisocyanate, diphenylmethane-4,4'-diisocyanate, 3,3'-dimethoxydiphenylmethane-4,4'-diisocyanate, 3,3'-dimethyldiphenylmethane-4,4'-diisocyanate, naphthylene-1, 5-diisocyanate, cyclobutylene-1,3-diisocyanate, cyclopentylene-1,3-diisocyanate, cyclohexylene-1,3-diisocyanate, cyclohexylene-1,4-diisocyanate, 1-methylcyclohexylene-2,4-diisocyanate, 1-methylcyclohexylene-2,6-diisocyanate, 1-isocyanate-3,3, 5-trimethyl-5-isocyanate methylcyclohexane, cyclohexane-1,3-bis(methylisocyanate), cyclohexane-1,4-bis (methylisocyanate), isophorone diisocyanate, dicyclohexylmethane-2,4'-diisocyanate, dicyclohexylmethane-4,4'-diisocyanate, ethylene diisocyanate, tetramethylene-1,4-diisocyanate, hexamethylene-1,6-diisocyanate, dodecamethylene-1,12-diisocyanate, lysine diisocyanate methyl ester and prepolymers having an isocyanate group at both terminals obtained from a reaction between a stoichiometrically excessive amount of one of the above organic diisocyanates and a bifunctional active hydrogen-containing compound.

The above diisocyanate may be used in combination with an organic polyisocyanate having 3 or more isocyanate groups, such as phenyl-1,3,5-triisocyanate, diphenylmethane-2,4,4'-triisocyanate, diphenylmethane-2, 5,4'-triisocyanate, triphenylmethane-2,4',4"-triisocyanate, triphenylmethane-4,4',4"-triisocyanate, diphenylmethane-2, 4,2',4'-tetraisocyanate, diphenylmethane-2,5,2',5'-tetraisocyanate, cyclohexane-1,3,5-triisocyanate, cyclohexane-1,3,5-tris(methylisocyanate), 3,5-dimethylcyclohexane-1,3,5-tris(methylisocyanate), 1,3,5-trimethylcyclohexane-1,3,5-tris(methylisocyanate), dicyclohexylmethane-2,4,2'-triisocyanate or dicyclohexylmethane-2,4,4'-triisocyanate, or a prepolymer having an isocyanate group at a terminal obtained from a reaction between a stoichiometrically excessive amount of one of the above organic polyisocyanates having 3 or more isocyanate groups and a polyfunctional active hydrogen-containing compound having 2 or more hydrogen atoms.

Examples of the above oxazoline compound include
2,2'-bis(2-oxazoline),
4-furan-2-ylmethylene-2-phenyl-4H-oxazol-5-one,
1,4-bis(4,5-dihydro-2-oxazolyl)benzene,
1,3-bis(4,5-dihydro-2-oxazolyl)benzene,
2,3-bis(4-isopropenyl-2-oxazolin-2-yl)butane,
2,2'-bis-4-benzyl-2-oxazoline,
2,6-bis(isopropyl-2-oxazolin-2-yl)pyridine,
2,2'-isopropylidenebis(4-tert-butyl-2-oxazoline),
2,2'-isopropylidenebis(4-phenyl-2-oxazoline),
2,2'-methylenebis(4-tert-butyl-2-oxazoline) and
2,2'-methylenebis(4-phenyl-2-oxazoline).
Examples of the above oxazine compound include
2,2'-bis(2-oxazine),
4-furan-2-ylmethylene-2-phenyl-4H-oxazyl-5-one,
1,4-bis(4,5-dihydro-2-oxazyl)benzene,
1,3-bis(4,5-dihydro-2-oxazyl)benzene,
2,3-bis(4-isopropenyl-2-oxazin-2-yl)butane,
2,2'-bis-4-benzyl-2-oxazine,
2,6-bis(isopropyl-2-oxazin-2-yl)pyridine,
2,2'-isopropylidenebis(4-tert-butyl-2-oxazine),
2,2'-isopropylidenebis(4-phenyl-2-oxazine),
2,2'-methylenebis(4-tert-butyl-2-oxazine) and
2,2'-methylenebis(4-phenyl-2-oxazine).
Examples of the above halogenated silyl compound include tetrahalogenosilanes such as tetrachlorosilane, tetrabromosilane, tetraiodosilane, trichlorobromosilane and dichlorodibromosilane; monoalkyltrihalogenosilanes such as methyltrichlorosilane, methyldichlorobromosilane and cyclohexyltrichlorosilane; monoaryltrihalogenosilanes such as phenyltrichlorosilane, naphthyltrichlorosilane, 4-chlorophenyltrichlorosilane and phenyldichlorobromosilane; monoaryloxytrihalogenosilanes such as phenoxytrichlorosilane and phenoxydichlorobromosilane; monoalkoxytrihalogenosilanes such as methoxytrichlorosilane and ethoxytrichlorosilane; dialkyldihalogenosilanes such as dimethyldichlorosilane, methyl(ethyl)dichlorosilane and methyl(cyclohexyl)dichlorosilane; monoalkylmonoaryldihalogenosilanes such as methyl(phenyl)dichlorosilane; diaryldihalogenosilanes such as diphenyldichlorosilane; diaryloxydihalogenosilanes such as diphenoxydichlorosilane; monoalkylmonoaryloxydihalogenosilanes such as methyl(phenoxy)dichlorosilane; monoarylmonoaryloxydihalogenosilanes such as phenyl(phenoxy)dichlorosilane; dialkoxydihalogenosilanes such as diethoxydichlorosilane; monoalkylmonoalkoxydichlorosilanes such as methyl(ethoxy)dichlorosilane; monoarylmonoethoxydichlorosilanes such as phenyl(ethoxy)dichlorosilane; trialkylmonohalogenosilanes such as trimethylchlorosilane, dimethyl(ethyl)chlorosilane and dimethyl(cyclohexyl)chlorosilane; dialkylmonoarylmonohalogenosilanes such as dimethyl(phenyl)chlorosilane; monoalkyldiarylmonohalogenosilanes such as methyl(diphenyl)chlorosilane; triaryloxymonohalogenosilanes such as triphenoxychlorosilane; monoalkyldiaryloxymonohalogenosilanes such as methyl(diphenoxy)chlorosilane; monoaryldiaryloxymonohalogenosilanes such as phenyl(diphenoxy)chlorosilane; dialkylmonoaryloxymonohalogenosilanes such as dimethyl(phenoxy)chlorosilane; diarylmonoaryloxymonohalogenosilanes such as diphenyl(phenoxy)chlorosilane; monoalkylmonoarylmonoaryloxymonohalgenosilanes such as methyl(phenyl)(phenoxy)chlorosilane; triethoxymonohalogenosilanes such as triethoxychlorosilane; and oligomers thereof such as dimer, trimer, tetramer and pentamer of tetrachlorosilane.

Examples of the above other silyl compound include hexamethyldisilazane, t-butyldimethylchlorosilane, bis(trimethylsilyl)trifluoroacetamide, diethylaminotrimethylsilane, trimethylsilanol, hexamethyldisiloxane, chloromethyldimethylethoxysilane, acetyltriphenylsilane, ethoxytriphenylsilane, triphenylsilanol, triethylsilanol, tripropylsilanol, tributylsilanol, hexaethyldisiloxane, trimethylmethoxysilane, trimethylethoxysilane, triethylmethoxysilane, triethylethoxysilane, acetoxyethyldimethylchlorosilane, 1,3-bis(hydroxybutyl)tetramethyldisiloxane, 1,3-bis(hydroxypropyl)tetramethyldisiloxane, γ-aminopropylmethoxysilane, γ-aminopropylethoxysilane, N-β(aminoethyl)-γ-aminopropyltrimethoxysilane, N-β(aminoethyl)-γ-aminopropylmethyldimethoxysilane, N-phenyl-γ-aminopropyltrimethoxysilane, γ-anilinopropyltrimethoxysilane, γ-dibutylaminopropyltrimethoxysilane, γ-ureidopropyltriethoxysilane, N-β(N-vinylbenzylaminoethyl)-γ-aminopropyltrimethoxysilane.hydrochlorate, γ-methacryloxypropyltrimethoxysilane, γ-methacryloxypropyltriethoxysilane, vinyltrimethoxysilane, vinyltriethoxysilane, vinyltrichlorosilane, vinyltris(β-methoxyethoxy)silane, γ-glycidoxypropylmethyldiethoxysilane, γ-glycidoxypropyltriethoxysilane, γ-(3,4-epoxycyclohexyl)ethyltrimethoxysilane, γ-glycidoxypropyltrimethoxysilane, γ-mercaptopropyltrimethoxysilane, γ-chloropropyltrimethoxysilane, trimethylchlorosilane, hexamethyldisilazane, N-trimethylsilylimidazole, bis(trimethylsilyl)urea, trimethylsilylacetamide, bistrimethylsilylacetamide, trimethylsilylisocyanate, trimethylmethoxysilane, trimethylethoxysilane, methyltrimethoxysilane, methyltriethoxysilane, dimethyldimethoxysilane, dimethyldiethoxysilane, t-butyldimethylchlorosilane, t-butyldiphenylchlorosilane, triisopropylchlorosilane, n-propyltrimethoxysilane, isobutyltrimethoxysilane, n-hexyltrimethoxysilane, n-decyltrimethoxysilane, n-hexadecyltrimethoxysilane, 1,6-bis(trimethoxysilyl)hexane, dimethylsilyldiisocyanate, methylsilyltriisocyanate, phenyltrimethoxysilane, diphenyldimethoxysilane and phenylsilyltriisocyanate.

The above known compounds may be used without restriction as the reactive oligomer compound. Although any reactive oligomer compound having a preferred refractive index can be selected according to the refractive index of the component (B) used, a compound containing an aromatic ring and a sulfur atom may be preferably used to increase the difference in refractive index between it and the component (B).

Preferably, a compound having a boiling point at 1 Torr (133.3 Pa) of preferably 160° C. or less, more preferably 130° C. or less is contained in an amount of at least 20 wt % as the polymerizable compound (A) in the present invention. When the amount of the compound is smaller than 20 wt %, a composition which provides a large difference in refractive index may not be obtained.

Out of the compounds other than the reactive oligomer compound enumerated above and contained in the polymerizable compound (A), vinyl aromatic compounds, vinyl ether compounds and (meth)acrylic acids advantageously provide a polymerizable compound having a boiling point at 1 Torr of 160° C. or less.

When a reactive oligomer compound is used as the polymerizable compound (A), the strength of a refractive index pattern formed by the method of the present invention is improved.

The above compounds enumerated as the component (A) may be used alone or in combination of two or more.

(B) Non-polymerizable Compound

The component (B) used in the present invention is a material which is stable to an acid, base or radical and preferably has high optical transparency. The refractive index of the component (B) can be set and adjusted to a preferred value according to application purpose. The refractive index $n_B$ of the compound (B) is smaller than the refractive index $n_A$ of the polymer of the polymerizable compound (A) and particularly preferably satisfies the following expression (1).

$$n_A - n_B \geq 0.05 \tag{1}$$

The non-polymerizable compound (B) can be a binding polymer, that is, a polymer which can serve as a binder for the compound (A).

Examples of the binding polymer (B) include acrylic resin, urethane resin, polyester resin, polycarbonate resin, norbornene resin, styrene resin, polyether sulfone resin, silicon resin, polyamide resin, polyimide resin, polysiloxane resin, fluororesin, polybutadiene resin, vinyl ether resin and vinyl ester resin. A preferred binding polymer (B) can be selected according to the refractive index of the polymer of the compound (A) used. To increase the difference in refractive index between it and the polymer of the compound (A) and to reduce a transmission loss for its long optical path, a binding polymer (B) obtained by substituting the hydrogen atom of the above resin with a fluorine atom may be advantageously used.

Illustrative examples of the binding polymer (B) include the following polymers (the figures within parentheses are refractive index values measured by d-ray): polyvinylidene fluoride (1.42), polydimethylsiloxane (1.43), polytrifluoroethyl methacrylate (1.44), polyoxypropylene (1.45), polyvinylisobutyl ether (1.45), polyvinyl ethyl (1.45), polyoxyethylene (1.46), polyvinyl butyl ether (1.46), polyvinyl pentyl ether (1.46), polyvinyl hexyl ether (1.46), poly(4-methyl-1-pentene) (1.46 to 1.47), cellulose acetate butyrate (1.46 to 1.49), poly(4-fluoro-2-trifluoromethylstyrene) (1.46), polyvinyl octyl ether (1.46), poly(vinyl 2-ethylhexyl ether) (1.46), polyvinyl decyl ether (1.46), poly(2-methoxyethyl acrylate) (1.46), polybutyl acrylate (1.46), poly(t-butyl methacrylate) (1.46), polyvinyl dodecyl ether (1.46), poly(3-ethoxypropyl acrylate) (1.47), polyoxycarbonyl tetramethylene (1.47), polyvinyl propionate (1.47), polyvinyl acetate (1.47), polyvinyl methyl ether (1.47), polyethyl acrylate (1.47), ethylene-vinyl acetate copolymer (1.47 to 1.50), (80% to 20% of vinyl acetate)cellulose propionate (1.47 to 1.49), cellulose acetate propionate (1.47), benzyl cellulose (1.47 to 1.58), phenol-formaldehyde resin (1.47 to 1.70), cellulose triacetate (1.47 to 1.48), polyvinyl methyl ether (isotactic) (1.47), poly(3-methoxypropyl acrylate) (1.47), poly(2-ethoxyethyl acrylate) (1.47), polymethyl acrylate (1.47 to 1.48), polyisopropyl methacrylate (1.47), poly(1-decene) (1.47), polypropylene (atactic, density of 0.8575 g/cm$^3$) (1.47), poly(vinyl sec-butyl ether) (isotactic) (1.47), polydodecyl methacrylate (1.47), polyoxyethylene oxysuccinoyl (1.47), (polyethylene succinate)polytetradecyl methacrylate (1.47), ethylene-propylene copolymer (EPR-rubber) (1.47 to 1.48), polyhexadecyl methacrylate (1.48), polyvinyl formate (1.48), poly(2-fluoroethyl methacrylate) (1.48), polyisobutyl methacrylate (1.48), ethyl cellulose (1.48), polyvinyl acetal (1.48 to 1.50), cellulose acetate (1.48 to 1.50), cellulose tripropionate (1.48 to 1.49), polyoxymethylene (1.48), polyvinyl butyral (1.48 to 1.49), poly(n-hexyl methacrylate) (1.48), poly(n-butyl methacrylate) (1.48), polyethylidene dimethacrylate (1.48), poly(2-ethoxyethyl methacrylate) (1.48), polyoxyethylene oxymaleoyl (1.48), (polyethylene maleate) poly(n-propyl methacrylate) (1.48), poly(3,3,5-trimethylcyclohexyl methacrylate) (1.49), polyethyl methacrylate (1.49), poly(2-nitro-2-methylpropyl methacrylate) (1.49), polytriethylcarbinyl methacrylate (1.49), poly(1,1-diethylpropyl methacrylate) (1.49), polymethyl methacrylate (1.49), poly(2-decyl-1,3-butadiene) (1.49), polyvinyl alcohol (1.49 to 1.53), polyethyl glycolate methacrylate (1.49), poly(3-methylcyclohexyl methacrylate) (1.49), poly(cyclohexyl α-ethoxyacrylate) (1.50), methyl cellulose (low viscosity) (1.50), poly(4-methylcyclohexyl methacrylate) (1.50), polydecamethylene glycol dimethacrylate (1.50), polyurethane (1.50 to 1.60), poly(1,2-butadiene) (1.50), polyvinyl formal (1.50), poly(2-bromo-4-trifluoromethylstyrene) (1.50), cellulose nitrate (1.50 to 1.51), poly(sec-butyl α-chloroacrylate) (1.50), poly(2-heptyl-1,3-butadiene) (1.50), poly(ethyl α-chloroacrylate) (1.50), poly(2-isopropyl-1,3-butadiene) (1.50), poly(2-methylcyclohexyl methacrylate) (1.50), polypropylene (density of 0.9075 g/cm$^3$) (1.50), polyisobutene (1.51), polybornyl methacrylate (1.51), poly(2-t-butyl-1,3-butadiene) (1.51), polyethylene glycol dimethacrylate (1.51), polycyclohexyl methacrylate (1.51), poly(cyclohexanediol-1,4-dimethacrylate) (1.51), butyl rubber (unvulcanized) (1.51), polytetrahydrofurfuryl methacrylate (1.51), guttapercha (β) (1.51), polyethylene ionomer (1.51), polyoxyethylene (high molecular weight) (1.51 to 1.54), polyethylene (density of 0.914 g/cm$^3$) (1.51), (density of 0.94 to 0.945 g/cm$^3$) (1.52 to 1.53), (density of 0.965 g/cm$^3$) (1.55), poly(1-methylcyclohexyl methacrylate) (1.51), poly(2-hydroxyethyl methacrylate) (1.51), polyvinyl chloroacetate (1.51), polybutene (isotactic) (1.51), polyvinyl methacrylate (1.51), poly(N-butyl-methacrylamide) (1.51), guttapercha (α) (1.51), terpene resin (1.52), poly(1,3-butadiene) (1.52), shellac (1.51 to 1.53), poly(methyl α-chloroacrylate) (1.52), poly(2-chloroethyl methacrylate) (1.52), poly(2-diethylaminoethyl methacrylate) (1.52), poly(2-chlorocyclohexyl methacrylate) (1.52), poly(1,3-butadiene) (35% of cis-form; 56% of trans-form 1.5180; 7% of 1,2-addition), natural rubber (1.52), polyallyl methacrylate (1.52), polyvinyl chloride+40% of dioctyl phthalate (1.52), polyacrylonitrile (1.52), polymethacrylonitrile (1.52), poly(1,3-butadiene) (rich with cis-form) (1.52), butadiene-acrylonitrile copolymer (1.52), polymethyl isopropenyl ketone (1.52), polyisoprene (1.52), polyester resin rigid (about 50% of styrene) (1.52 to 1.54), poly(N-(2-methoxyethyl)methacrylamide) (1.52), poly(2,3-dimethylbutadiene) (methyl rubber) (1.53), vinyl chloride-vinyl acetate copolymer (95/5 to 90/10) (1.53 to 1.54), polyacrylic acid (1.53), poly(1,3-dichloropropyl methacrylate) (1.53), poly(2-chloro-1-(chloromethyl)ethyl methacrylate) (1.53), polyacrolein (1.53), poly(1-vinyl-2-pyrrolidone) (1.53), rubber hydrochloride (1.53 to 1.55), nylon 6; nylon 6,6; nylon 6,10 (molded product) (1.53), butadiene-styrene copolymer (about 30% of styrene) (1.53), poly(cyclohexyl-α-chloroacrylate) block copolymer (1.53), poly(2-chloroethyl-α-chloroacrylate) (1.53), butadiene-styrene copolymer (about 75/25) (1.54), poly(2-aminoethyl methacrylate) (1.54), polyfurfuryl methacrylate (1.54), polybutylmercaptyl methacrylate (1.54), poly(1-phenyl-N-amyl methacrylate) (1.54), poly(N-methyl-methacrylamide) (1.54), cellulose (1.54), polyvinyl chloride (1.54 to 1.55), urea formaldehyde resin (1.54 to 1.56), poly(sec-butyl α-bromoacrylate) (1.54), poly(cyclohexyl α-bromoacrylate) (1.54), poly(2-bromoethyl methacrylate) (1.54), polydihydroabietic acid (1.54), polyabietic acid (1.546), polyethylmercaptyl methacrylate (1.55), poly(N-allylmethacrylamide) (1.55), poly(1-phenylethyl methacrylate) (1.55), polyvinylfuran (1.55), poly(2-vinyltetrahydrofuran) (1.55), poly(vinylchloride)+40% of tricresyl phosphate (1.55), poly(p-methoxybenzyl methacrylate) (1.55), polyisopropyl methacrylate) (1.55), poly(p-isopropylstyrene) (1.55), polychloroprene (1.55 to 1.56), poly(oxyethylene-α-benzoate-ω-methacrylate) (1.56), poly(p,p'-xylylenyl dimethacrylate) (1.56), poly(1-phenylallyl methacrylate) (1.56), poly(p-cyclohexylphenyl methacrylate) (1.56), poly(2-phenylethyl methacrylate) (1.56), poly(oxycarbonyloxy-1,4-phenylene-1-propyl) (1.56), poly(1-(o-chlorophenyl)ethyl methacrylate) (1.56), styrene-maleic anhydride copolymer (1.56), poly(1-phenylcyclohexyl methacrylate) (1.56), poly(oxycarbonyloxy-1,4-phenylene-1,3-dimethyl-butylidene-1,4-phenylene) (1.57), poly(methyl α-bromoacrylate) (1.57), polybenzyl methacrylate (1.57), poly(2-(phenylsulfonyl)ethyl methacrylate) (1.57), poly(m-cresyl methacrylate) (1.57), styrene-acrylonitrile copolymer (about 75/25) (1.57), poly(oxycarbonyloxy-1,4-phenylene isobutylidene-1,4-phenylene) (1.57), poly(o-methoxyphenyl methacrylate) (1.57), polyphenyl methacrylate (1.57), poly(o-cresyl methacrylate) (1.57), polydiallyl phthalate (1.57), poly(2,3-dibromopropyl methacrylate) (1.57), poly(oxycarbonyloxy- 1,4-phenylene-1-methyl-butylidene-1,4-phenylene) (1.57), poly(oxy-2,6-dimethylphenylene) (1.58), polyoxyethylene oxyterephthaloyl (amorphous) (1.58) polyethylene terephthalate (1.51 to 1.64), polyvinyl benzoate (1.58), poly(oxycarbonyloxy-1,4-phenylenebutylidene-1,4-phenylene) (1.58), poly(1,2-diphenylethyl methacrylate) (1.58), poly(o-chlorobenzyl methacrylate) (1.58), poly(oxycarbonyloxy-1,4-phenylene-sec-butylidene-1,4-phenylene) (1.58), poly-oxypentaerythritoloxyphthaloyl (1.58), poly(m-nitrobenzyl methacrylate) (1.58), poly(oxycarbonyloxy-1,4-phenyleneisopropylidene-1,4-phenylene) (1.59), poly(N-(2-phenylethyl)methacrylamide) (1.59), poly(4-methoxy-2-methylstyrene) (1.59), poly(o-methylstyrene) (1.59), polystyrene (1.59), poly(oxycarbonyloxy-1,4-phenylenecyclohexylidene-1,4-phenylene) (1.59), poly(o-methoxystyrene) (1.59), polydiphenylmethyl methacrylate (1.59), poly(oxycarbonyloxy-1,4-phenyleneethylidene-1,4-phenylene) (1.59), poly(p-bromophenyl methacrylate) (1.60), poly(N-benzylmethacrylamide) (1.60), poly(p-methoxystyrene) (1.60), polyvinylidene chloride (1.60 to 1.63), polysulfide ("Thiokol") (1.6 to 1.7), poly(o-chlorodiphenylmethyl methacrylate) (1.60), poly(oxycarbonyloxy-1,4-(2,6-dichloro)phenylene-isopropylidene-1,4-(2,6-dichloro)phenylene) (1.61), poly(oxycarbonyloxybis(1,4-(3,5-dichlorophenylene))) polypentachlorophenyl methacrylate (1.61), poly(o-chlorostyrene) (1.61), poly(phenyl α-bromoacrylate) (1.61), poly(p-divinylbenzene) (1.62), poly(N-vinylphthalimide) (1.62), poly(2,6-dichlorostyrene) (1.62), poly(β-naphthyl methacrylate) (1.63), poly(α-naphthylcarbinyl methacrylate) (1.63), polysulfone (1.63), poly(2-vinylthiophene) (1.64), poly(α-naphthyl methacrylate) (1.64), poly(oxycarbonyloxy-1,4-phenylenediphenyl-methylene-1,4-phenylene) (1.65), polyvinylphenyl sulfide (1.66), butylphenol formaldehyde resin (1.66), urea-thiourea-formaldehyde resin (1.66), polyvinyl naphthalene (1.68), polyvinyl carbazole (1.68), naphthalene-formaldehyde resin (1.70), phenol-formaldehyde resin (1.70) and polypentabromophenyl methacrylate (1.71).

Out of these, polymers having a d-ray refractive index of 1.6 or less are preferred and polymers having a d-ray refractive index of 1.5 or less are more preferred.

The weight average molecular weight of the non-polymerizable compound (B), particularly the binding polymer is preferably 100 to 500,000, more preferably 100 to 200,000.

A hydrolysate of a compound represented by the following formula (1) or a condensate thereof is also used as the non-polymerizable compound (B):

$$R^1_n Si(OR^2)_{4-n} \quad (1)$$

wherein $R^1$ and $R^2$ may be the same or different and each a monovalent organic group, and n is an integer of 0 to 2.

Examples of the monovalent organic group in the above formula (1) include alkyl group, alicyclic group, aryl group, allyl group and glycidyl group. Examples of the alkyl group include methyl group, ethyl group, propyl group and butyl group. The number of carbon atoms of the alkyl group is preferably 1 to 5. The alkyl group may be linear or branched and may contain a halogen atom such as fluorine atom substituted for its hydrogen atom. Examples of the alicyclic group include cyclohexyl group and norbornyl group. Examples of the aryl group include phenyl group and naphthyl group. n is preferably 0 or 1 in the above formula (1).

Illustrative examples of the compound represented by the above formula (1) include methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butylisotriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, cyclohexyltrimethoxysilane, cyclohexyltriethoxysilane, cyclohexyltri-n-propoxysilane, cyclohexyltriisopropoxysilane, cyclohexyltri-n-butoxysilane, cyclohexyltri-sec-butoxysilane, cyclohexyltri-tert-butoxysilane, cyclohexyltriphenoxysilane, norbornyltrimethoxysilane, norbornyltriethoxysilane, norbornyltri-n-propoxysilane, norbornyltriisopropoxysilane, norbornyltri-n-butoxysilane, norbornyltri-sec-butoxysilane, norbornyltri-tert-butoxysilane, norbornyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-secbutoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, dicyclohexyldimethoxysilane, dicyclohexyldiethoxysilane, dicyclohexyldi-n-propoxysilane, dicyclohexyldiisopropoxysilane, dicyclohexyldi-n-butoxysilane, dicyclohexyldi-sec-butoxysilane, dicyclohexyldi-tert-butoxysilane, dicyclohexyldiphenoxysilane, dinorbornyldimethoxysilane, dinorbornyldiethoxysilane, dinorbornyldi-n-propoxysilane, dinorbornyldiisopropoxysilane, dinorbornyldi-n-butoxysilane, dinorbornyldi-sec-butoxysilane, dinorbornyldi-tert-butoxysilane, dinorbornyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, divinyltrimethoxysilane, γ-aminopropyltrimethoxysilane, γ-aminopropyltriethoxysilane, γ-glycidyloxypropyltrimethoxysilane, γ-glycidyloxypropyltriethoxysilane, γ-trifluoropropyltrimethoxysilane and γ-trifluoropropyltriethoxysilane. Compounds obtained by substituting fluorine atoms for some or all of the hydrogen atoms of the above compounds may also be used. These alkylalkoxysilanes may be used alone or in combination of two or more.

Out of the compounds represented by the above formula (1), alkyltrialkoxysilanes of the formula (1) in which $R^1$ and $R^2$ are both an alkyl group and n is 1 are particularly preferred.

Out of these, methyltrimethoxysilane and methyltriethoxysilane are preferred. When methyltrimethoxysilane and/or methyltriethoxysilane are/is used in an amount of 70 mol % or more based on the total of all the alkylalkoxysilanes, a cured product having good balance between heat resistance and refractive index is obtained. Preferably, a hydrolysate of a compound represented by the above formula (1) and a condensate thereof have a weight average molecular weight in terms of polystyrene of 500 to 100,000.

The hydrolytic reaction and condensation reaction of a hydrolysate of a compound represented by the above formula (1) and a condensate thereof as the component (B) are carried out in the presence of water and a suitable catalyst as will be described hereinbelow.

Stated more specifically, the compound represented by the above formula (1) is dissolved in a suitable organic solvent and water is intermittently or continuously added to this solution. The catalyst may be dissolved or dispersed in the organic solvent in advance, or dissolved or dispersed in water to be added.

The temperature for carrying out the hydrolytic reaction and condensation reaction is preferably 0 to 100° C., more preferably 15 to 80° C.

Water for carrying out the hydrolysis and condensation of the compound represented by the above formula (1) is preferably ion exchange water.

The amount of water is preferably 0.25 to 3 mols, particularly preferably 0.3 to 2.5 mols based on 1 mol of the total of groups represented by $R^2O$— of the compound represented by the above formula (1).

The catalyst for carrying out the hydrolysis and condensation of the compound represented by the above formula (1) is a metal chelate compound, organic acid, inorganic acid, organic base or inorganic base.

Examples of the metal chelate compound used as the catalyst include titanium chelate compounds such as
triethoxy.mono(acetylacetonato)titanium,
tri-n-propoxy.mono(acetylacetonato)titanium,
tri-i-propoxy.mono(acetylacetonato)titanium,
tri-n-butoxy.mono(acetylacetonato)titanium,
tri-sec-butoxy.mono(acetylacetonato)titanium,
tri-t-butoxy.mono(acetylacetonato)titanium,
diethoxy.bis(acetylacetonato)titanium,
di-n-propoxy.bis(acetylacetonato)titanium,
di-i-propoxy.bis(acetylacetonato)titanium,
di-n-butoxy.bis(acetylacetonato)titanium,
di-sec-butoxy.bis(acetylacetonato)titanium,
di-t-butoxy.bis(acetylacetonato)titanium,
monoethoxy.tris(acetylacetonato)titanium,
mono-n-propoxy.tris(acetylacetonato)titanium,
mono-i-propoxy.tris(acetylacetonato)titanium,
mono-n-butoxy.tris(acetylacetonato)titanium,
mono-sec-butoxy.tris(acetylacetonato)titanium,
mono-t-butoxy.tris(acetylacetonato)titanium,
tetrakis(acetylacetonato)titanium,
triethoxy.mono(ethylacetoacetate)titanium,
tri-n-propoxy.mono(ethylacetoacetate)titanium,
tri-i-propoxy.mono(ethylacetoacetate)titanium,
tri-n-butoxy.mono(ethylacetoacetate)titanium,
tri-sec-butoxy.mono(ethylacetoacetate)titanium,
tri-t-butoxy.mono(ethylacetoacetate)titanium,
diethoxy.bis(ethylacetoacetate)titanium,
di-n-propoxy.bis(ethylacetoacetate)titanium,
di-i-propoxy.bis(ethylacetoacetate)titanium,
di-n-butoxy.bis(ethylacetoacetate)titanium,
di-sec-butoxy.bis(ethylacetoacetate)titanium,
di-t-butoxy.bis(ethylacetoacetate)titanium,
monoethoxy.tris(ethylacetoacetate)titanium,
mono-n-propoxy.tris(ethylacetoacetate)titanium,
mono-i-propoxy.tris(ethylacetoacetate)titanium,
mono-n-butoxy.tris(ethylacetoacetate)titanium,
mono-sec-butoxy.tris(ethylacetoacetate)titanium,
mono-t-butoxy.tris(ethylacetoacetate)titanium,
tetrakis(ethylacetoacetate)titanium,
mono(acetylacetonato)tris(ethylacetoacetate)titanium,
bis(acetylacetonato)bis(ethylacetoacetate)titanium and
tris(acetylacetonato)mono(ethylacetoacetate)titanium;
zirconium chelate compounds such as
triethoxy.mono(acetylacetonato)zirconium,
tri-n-propoxy.mono(acetylacetonato)zirconium,
tri-i-propoxy.mono(acetylacetonato)zirconium,
tri-n-butoxy.mono(acetylacetonato)zirconium,
tri-sec-butoxy.mono(acetylacetonato)zirconium,
tri-t-butoxy.mono(acetylacetonato)zirconium,
diethoxy.bis(acetylacetonato)zirconium,
di-n-propoxy.bis(acetylacetonato)zirconium,
di-i-propoxy.bis(acetylacetonato)zirconium,
di-n-butoxy.bis(acetylacetonato)zirconium,
di-sec-butoxy.bis(acetylacetonato)zirconium, di-t-butoxy.bis(acetylacetonato)zirconium,
monoethoxy.tris(acetylacetonato)zirconium,
mono-n-propoxy.tris(acetylacetonato)zirconium,
mono-i-propoxy.tris(acetylacetonato)zirconium,
mono-n-butoxy.tris(acetylacetonato)zirconium,
mono-sec-butoxy.tris(acetylacetonato)zirconium,
mono-t-butoxy.tris(acetylacetonato)zirconium,
tetrakis(acetylacetonato)zirconium,
triethoxy.mono(ethylacetoacetate)zirconium,
tri-n-propoxy.mono(ethylacetoacetate)zirconium,
tri-i-propoxy.mono(ethylacetoacetate)zirconium,
tri-n-butoxy.mono(ethylacetoacetate)zirconium,
tri-sec-butoxy.mono(ethylacetoacetate)zirconium,
tri-t-butoxy.mono(ethylacetoacetate)zirconium,
diethoxy.bis(ethylacetoacetate)zirconium,
di-n-propoxy.bis(ethylacetoacetate)zirconium,
di-i-propoxy.bis(ethylacetoacetate)zirconium,
di-n-butoxy.bis(ethylacetoacetate)zirconium,
di-sec-butoxy.bis(ethylacetoacetate)zirconium,
di-t-butoxy.bis(ethylacetoacetate)zirconium,
monoethoxy.tris(ethylacetoacetate)zirconium,
mono-n-propoxy.tris(ethylacetoacetate)zirconium,
mono-i-propoxy.tris(ethylacetoacetate)zirconium,
mono-n-butoxy.tris(ethylacetoacetate)zirconium,
mono-sec-butoxy.tris(ethylacetoacetate)zirconium,
mono-t-butoxy.tris(ethylacetoacetate)zirconium,
tetrakis(ethylacetoacetate)zirconium,
mono(acetylacetonato)tris(ethylacetoacetate)zirconium,
bis(acetylacetonato)bis(ethylacetoacetate)zirconium and
tris(acetylacetonato)mono(ethylacetoacetate)zirconium;
and aluminum chelate compounds such as
tris(acetylacetonato)aluminum and
tris(ethylacetoacetate)aluminum.

Examples of the organic acid used as the catalyst include acetic acid, propionic acid, butanoic acid, pentanoic acid, hexoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid and tartaric acid.

Examples of the inorganic acid used as the catalyst include hydrochloric acid, nitric acid, sulfuric acid, hydrofluoric acid and phosphoric acid.

Examples of the organic base used as the catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene and tetramethylammonium hydroxide.

Examples of the inorganic base used as the catalyst include ammonia, sodium hydroxide, potassium hydroxide, barium hydroxide and calcium hydroxide.

Out of these, a metal chelate compound, an organic acid or an inorganic acid is preferably used as the catalyst and a titanium chelate compound or an organic acid is more preferably used.

These compounds may be used alone or in combination of two or more as the catalyst.

The amount of the catalyst is preferably 0.001 to 10 parts by weight, more preferably 0.01 to 10 parts by weight based on 100 parts by weight of the compound represented by the above formula (1) in terms of $SiO_2$.

Further, it is preferred to remove the residual water and an alcohol formed as a reaction by-product after the hydrolysis and condensation of the compound represented by the above formula (1).

A ladder type polysilsesquioxane represented by the following formula (2), a hydrolysate thereof or a condensate of the hydrolysate is preferably used as the non-polymerizable compound (B):

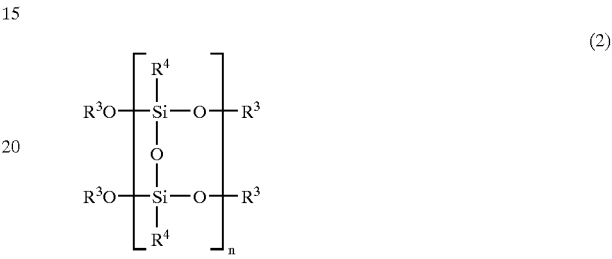

wherein $R^3$ is a monovalent organic group, $R^4$ is a hydrogen atom or monovalent organic group, $R^3$ and $R^4$ may be the same or different, and n is a positive integer corresponding to the molecular weight.

Examples of the monovalent organic group in the above formula (2) include an alkyl group, alicyclic group, aryl group, allyl group and glycidyl group. Examples of the alkyl group include methyl group, ethyl group and propyl group. The number of carbon atoms of the alkyl group is preferably 1 to 5. The alkyl group may be linear or branched. Examples of the alicyclic group include cyclohexyl group and norbornyl group. Examples of the aryl group include phenyl group, naphthyl group and tolyl group. Further, the hydrogen atoms of the alkyl group, aryl group, allyl group and glycidyl group may be substituted by a halogen atom such as fluorine atom.

The method of producing the compound having a structure represented by the above formula (2) is disclosed by, for example, JP-A 56-157885, JP-A 57-40526 and JP-A 58-69217. Commercially available products of the compound include GR-100, GR-650, GR-908 and GR-950 (of Showa Denko KK).

The hydrolytic reaction and condensation reaction of the compound represented by the above formula (2) can be carried out under similar conditions (catalyst, water, reaction temperature) to those of the hydrolytic/condensation reactions of the compound represented by the above formula (1). The weight average molecular weight in terms of polystyrene of the compound represented by the above formula (2), a hydrolysate thereof or a condensate of the hydrolysate is preferably 500 to 500,000, more preferably 500 to 300,000.

The amount of the component (B) is preferably 10 to 95 parts by weight, more preferably 10 to 90 parts by weight, much more preferably 20 to 90 parts by weight, particularly preferably 20 to 70 parts by weight based on 100 parts by weight of the total of the components (A) and (B). When the amount of the component (B) is smaller than 10 parts by weight, the obtained refractive index changing material is apt to be brittle and when the amount is larger than 90 parts by weight, the obtained refractive index difference tends to be small.

(C) Radiation Sensitive Polymerization Initiator

The radiation sensitive polymerization initiator (C) used in the present invention can be a radiation sensitive acid generator, a radiation sensitive base generator or a radiation sensitive radical generator. In this case, it is preferred to use a radiation sensitive acid generator as the radiation sensitive polymerization initiator (C) when an acid reactive compound is used as the polymerizable compound (A), a radiation sensitive base generator as the radiation sensitive polymerization initiator (C) when a base reactive compound is used as the polymerizable compound (A) and a radiation sensitive radical generator as the radiation sensitive polymerization initiator (C) when a radical reactive compound is used as the polymerizable compound (A). The above radiation sensitive acid generator is selected from a trichloromethyl-s-triazine, diaryl iodonium salt, triaryl sulfonium salt, quaternary ammonium salt and sulfonic acid ester.

Examples of the trichloromethyl-s-triazine include
2,4,6-tris(trichloromethyl)-s-triazine,
2-phenyl-4,6-bis(trichloromethyl)-s-triazine,
2-(4-chlorophenyl)-4,6-bis(trichloromethyl)-s-triazine,
2-(3-chlorophenyl)-4,6-bis(trichloromethyl)-s-triazine,
2-(2-chlorophenyl)-4,6-bis(trichloromethyl)-s-triazine,
2-(4-methoxyphenyl)-4,6-bis(trichloromethyl)-s-triazine,
2-(3-methoxyphenyl)-4,6-bis(trichloromethyl)-s-triazine,
2-(2-methoxyphenyl)-4,6-bis(trichloromethyl)-s-triazine,
2-(4-methylthiophenyl)-4,6-bis(trichloromethyl)-s-triazine,
2-(3-methylthiophenyl)-4,6-bis(trichloromethyl)-s-triazine,
2-(2-methylthiophenyl)-4,6-bis(trichloromethyl)-s-triazine,
2-(4-methoxynaphthyl)-4,6-bis(trichloromethyl)-s-triazine,
2-(3-methoxynaphthyl)-4,6-bis(trichloromethyl)-s-triazine,
2-(2-methoxynaphthyl)-4,6-bis(trichloromethyl)-s-triazine,
2-(4-methoxy-β-styryl)-4,6-bis(trichloromethyl)-s-triazine,
2-(3-methoxy-β-styryl)-4,6-bis(trichloromethyl)-s-triazine,
2-(2-methoxy-β-styryl)-4,6-bis(trichloromethyl)-s-triazine,
2-(3,4,5-trimethoxy-β-styryl)-4,6-bis(trichloromethyl)-s-triazine,
2-(4-methylthio-β-styryl)-4,6-bis(trichloromethyl)-s-triazine,
2-(3-methylthio-β-styryl)-4,6-bis(trichloromethyl)-s-triazine,
2-(3-methylthio-β-styryl)-4,6-bis(trichloromethyl)-s-triazine,
2-piperonyl-4,6-bis(trichloromethyl)-s-triazine,
2-[2-(furan-2-yl)ethenyl]-4,6-bis(trichloromethyl)-s-triazine, 2-[2-(5-methylfuran-2-yl)ethenyl]-4,6-bis(trichloromethyl)-s-triazine and
2-[2-(4-diethylamino-2-methylphenyl)ethenyl]-4,6-bis(trichloromethyl)-s-triazine.

Examples of the above diaryl iodonium salt include diphenyliodonium tetrafluoroborate, diphenyliodonium hexafluorophosphonate, diphenyliodonium hexafluoroarsenate, diphenyliodonium trifluoromethane sulfonate, diphenyliodonium trifluoroacetate, diphenyliodonium-p-toluene sulfonate, diphenyliodonium butyltris(2,6-difluorophenyl)borate, diphenyliodonium hexyltris(p-chlorophenyl)borate, diphenyliodonium hexyltris(3-trifluoromethylphenyl)borate, 4-methoxyphenylphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethane sulfonate, 4-methoxyphenylphenyliodonium trifluoroacetate, 4-methoxyphenylphenyliodonium-p-toluene sulfonate, 4-methoxyphenylphenyliodonium butyltris(2,6-difluorophenyl)borate, 4-methoxyphenylphenyliodonium hexyltris(p-chlorophenyl)borate, 4-methoxyphenylphenyliodonium hexyltris(3-trifluoromethylphenyl)borate, bis(4-tert-butylphenyl)iodonium tetrafluoroborate, bis(4-tert-butylphenyl)iodonium hexafluoroarsenate, bis(4-tert-butylphenyl)iodonium trifluoromethane sulfonate, bis(4-tert-butylphenyl)iodonium trifluoroacetate, bis(4-tert-butylphenyl)iodonium-p-toluene sulfonate, bis(4-tert-butylphenyl)iodonium butyltris(2,6-difluorophenyl)borate, bis(4-tert-butylphenyl)iodonium hexyltris(p-chlorophenyl)borate and bis(4-tert-butylphenyl)iodonium hexyltris(3-trifluoromethylphenyl)borate.

Examples of the above triaryl sulfonium salt include triphenylsulfonium tetrafluoroborate, triphenylsulfonium hexafluorophosphonate, triphenylsulfonium hexafluoroarsenate, triphenylsulfonium trifluoromethane sulfonate, triphenylsulfonium trifluoroacetate, triphenylsulfonium-p-toluene sulfonate, triphenylsulfonium butyltris(2,6-difluorophenyl)borate, triphenylsulfonium hexyltris(p-chlorophenyl)borate, triphenylsulfonium hexyltris(3-trifluoromethylphenyl)borate, 4-methoxyphenyldiphenylsulfonium tetrafluoroborate, 4-methoxyphenyldiphenylsulfonium hexafluorophosphonate, 4-methoxyphenyldiphenylsulfonium hexafluoroarsenate, 4-methoxyphenyldiphenylsulfonium trifluoromethane sulfonate, 4-methoxyphenyldiphenylsulfonium trifluoroacetate, 4-methoxyphenyldiphenylsulfonium-p-toluene sulfonate, 4-methoxyphenyldiphenylsulfonium butyltris(2,6-difluorophenyl)borate, 4-methoxyphenyldiphenylsulfonium hexyltris(p-chlorophenyl)borate, 4-methoxyphenyldiphenylsulfonium hexyltris(3-trifluoromethylphenyl)borate, 4-phenylthiophenyldiphenylsulfonium tetrafluoroborate, 4-phenylthiophenyldiphenylsulfonium hexafluorophosphonate, 4-phenylthiophenyldiphenylsulfonium hexafluoroarsenate, 4-phenylthiophenyldiphenylsulfonium trifluoromethane sulfonate, 4-phenylthiophenyldiphenylsulfonium trifluoroacetate, 4-phenylthiophenyldiphenylsulfonium-p-toluene sulfonate, 4-phenylthiophenyldiphenylsulfonium butyltris(2,6-difluorophenyl)borate, 4-phenylthiophenyldiphenylsulfonium hexyltris(p-chlorophenyl)borate, 4-phenylthiophenyldiphenylsulfonium hexyltris(3-trifluoromethylphenyl)borate, 4-hydroxy-1-naphthalenyldimethylsulfonium tetrafluoroborate, 4-hydroxy-1-naphthalenyldimethylsulfonium hexafluorophosphonate, 4-hydroxy-1-naphthalenyldimethylsulfonium hexafluoroarsenate, 4-hydroxy-1-naphthalenyldimethylsulfonium trifluoromethane sulfonate, 4-hydroxy-1-naphthalenyldimethylsulfonium trifluoroacetate, 4-hydroxy-1-naphthalenyldimethylsulfonium-p-toluene sulfonate, 4-hydroxy-1-naphthalenyldimethylsulfonium butyltris(2,6- difluorophenyl)borate, 4-hydroxy-1-naphthalenyldimethylsulfonium hexyltris(p-chlorophenyl)borate and 4-hydroxy-1-naphthalenyldimethylsulfonium hexyltris(3-trifluoromethylphenyl)borate.

Examples of the above quaternary ammonium salt include tetramethylammonium tetrafluoroborate, tetramethylammonium hexafluorophosphonate, tetramethylammonium hexafluoroarsenate, tetramethylammonium trifluoromethane sulfonate, tetramethylammonium trifluoroacetate, tetramethylammonium-p-toluene sulfonate, tetramethylammonium butyltris(2,6-difluorophenyl)borate, tetramethylammonium hexyltris(p-chlorophenyl)borate, tetramethylammonium hexyltris(3-trifluoromethylphenyl)borate, tetrabutylammonium tetrafluoroborate, tetrabutylammonium hexafluorophosphonate, tetrabutylammonium hexafluoroarsenate, tetrabutylammonium trifluoromethane sulfonate, tetrabutylammonium trifluoroacetate, tetrabutylammonium-p-toluene sulfonate, tetrabutylammonium butyltris(2,6-difluorophenyl)borate, tetrabutylammonium hexyltris(p-chlorophenyl)borate, tetrabutylammonium hexyltris(3-trifluoromethylphenyl)borate, benzyltrimethylammonium tetrafluoroborate, benzyltrimethylammonium hexafluorophosphonate, benzyltrimethylammonium hexafluoroarsenate, benzyltrimethylammonium trifluoromethane sulfonate, benzyltrimethylammonium trifluoroacetate, benzyltrimethylammonium-p-toluene sulfonate, benzyltrimethylammonium butyltris(2,6-difluorophenyl)borate, benzyltrimethylammonium hexyltris(p-chlorophenyl)borate, benzyltrimethylammonium hexyltris(3-trifluoromethylphenyl)borate, benzyldimethylphenylammonium tetrafluoroborate, benzyldimethylphenylammonium hexafluorophosphonate, benzyldimethylphenylammonium hexafluoroarsenate, benzyldimethylphenylammonium trifluoromethane sulfonate, benzyldimethylphenylammonium trifluoroacetate, benzyldimethylphenylammonium-p-toluene sulfonate, benzyldimethylphenylammonium butyltris(2,6-difluorophenyl)borate, benzyldimethylphenylammonium hexyltris(p-chlorophenyl)borate, benzyldimethylphenylammonium hexyltris(3-trifluoromethylphenyl)borate, N-cinnamylideneethylphenylammonium tetrafluoroborate, N-cinnamylideneethylphenylammonium hexafluorophosphonate, N-cinnamylideneethylphenylammonium hexafluoroarsenate, N-cinnamylideneethylphenylammonium trifluoromethane sulfonate, N-cinnamylideneethylphenylammonium trifluoroacetate, N-cinnamylideneethylphenylammonium-p-toluene sulfonate, N-cinnamylideneethylphenylammonium butyltris(2,6-difluorophenyl)borate, N-cinnamylideneethylphenylammonium hexyltris(p-chlorophenyl)borate and N-cinnamylideneethylphenylammonium hexyltris(3-trifluoromethylphenyl)borate.

Examples of the above sulfonic acid ester include α-hydroxymethylbenzoin-p-toluenesulfonic acid ester, α-hydroxymethylbenzoin-trifluoromethanesulfonic acid ester, α-hydroxymethylbenzoin-methanesulfonic acid ester, pyrogallol-tri(p-toluenesulfonic acid)ester, pyrogallol-tri(trifluoromethanesulfonic acid)ester, pyrogallol-trimethanesulfonic acid ester, 2,4-dinitrobenzyl-p-toluenesulfonic acid ester, 2,4-dinitrobenzyl-trifluoromethanesulfonic acid ester, 2,4-dinitrobenzyl-methanesulfonic acid ester, 2,4-dinitrobenzyl-1,2-naphthoquinonediazido-5-sulfonic acid ester, 2,6-dinitrobenzyl-p-toluenesulfonic acid ester, 2,6-dinitrobenzyl-trifluoromethanesulfonic acid ester, 2,6-dinitrobenzyl-methanesulfonic acid ester, 2,6-dinitrobenzyl-1,2-naphthoquinonediazido-5-sulfonic acid ester, 2-nitrobenzyl-p-toluenesulfonic acid ester, 2-nitrobenzyl-trifluoromethanesulfonic acid ester, 2-nitrobenzyl-methanesulfonic acid ester, 2-nitrobenzyl-1,2-naphthoquinonediazido-5-sulfonic acid ester, 4-nitrobenzyl-p-toluenesulfonic acid ester, 4-nitrobenzyl-trifluoromethanesulfonic acid ester, 4-nitrobenzyl-methanesulfonic acid ester, 4-nitrobenzyl-1,2-naphthoquinonediazido-5-sulfonic acid ester, N-hydroxynaphthalimido-p-toluensulfonic acid ester, N-hydroxynaphthalimido-trifluoromethanesulfonic acid ester, N-hydroxynaphthalimido-methanesulfonic acid ester, N-hydroxy-5-norbornene-2,3-dicarboxyimido-p-toluensulfonic acid ester, N-hydroxy-5-norbornene-2,3-dicarboxyimido-trifluoromethanesulfonic acid ester, N-hydroxy-5-norbornene-2,3-dicarboxyimido-methanesulfonic acid ester, 2,4,6,3',4',5'-hexahydroxybenzophenone-1,2-naphthoquinonediazido-4-sulfonic acid ester and 1,1,1-tri(p-hydroxyphenyl)ethane-1,2-naphthoquinonediazido-4-sulfonic acid ester.

Out of these compounds, 2-(3-chlorophenyl)-4,6-bis(trichloromethyl)-s-triazine, 2-(4-methoxyphenyl)-4,6-bis(trichloromethyl)-s-triazine, 2-(4-methylthiophenyl)-4,6-bis(trichloromethyl)-s-triazine, 2-(4-methoxy-β-styryl)-4,6-bis(trichloromethyl)-s-triazine, 2-piperonyl-4,6-bis(trichloromethyl)-s-triazine, 2-[2-(furan-2-yl)ethenyl]-4,6-bis(trichloromethyl)-s-triazine, 2-[2-(5-methylfuran-2-yl)ethenyl]-4,6-bis(trichloromethyl)-s-triazine, 2-[2-(4-diethylamino-2-methylphenyl)ethenyl]-4,6-bis(trichloromethyl)-s-triazine and 2-(4-methoxynaphthyl)-4,6-bis(trichloromethyl)-s-triazine are preferred as trichloromethyl-s-triazines; diphenyliodonium trifluoroacetate, diphenyliodonium trifluoromethane sulfonate, 4-methoxyphenylphenyliodonium trifluoromethane sulfonate and 4-methoxyphenylphenyliodonium trifluoroacetate are preferred as diaryl iodonium salts; triphenylsulfonium trifluoromethane sulfonate, triphenylsulfonium trifluoroacetate, 4-methoxyphenyldiphenylsulfonium trifluoromethane sulfonate, 4-methoxyphenyldiphenylsulfonium trifluoroacetate, 4-phenylthiophenyldiphenylsulfonium trifluoromethane sulfonate and 4-phenylthiophenyldiphenylsulfonium trifluoroacetate are preferred as triaryl sulfonium salts; tetramethylammonium butyltris(2,6-difluorophenyl)borate, tetramethylammonium hexyltris(p-chlorophenyl)borate, tetramethylammonium hexyltris(3-trifluoromethylphenyl)borate, benzyldimethylphenylammonium butyltris(2,6-difluorophenyl)borate, benzyldimethylphenylammonium hexyltris(p-chlorophenyl)borate and benzyldimethylphenylammonium hexyltris(3-trifluoromethylphenyl)borate are preferred as quaternary ammonium salts; and 2,6-dinitrobenzyl-p-toluenesulfonic acid ester, 2,6-dinitrobenzyl-trifluoromethanesulfonic acid ester, N-hydroxynaphthalimido-p-toluenesulfonic acid ester and N-hydroxynaphthalimido-trifluoromethanesulfonic acid ester are preferred as sulfonic acid esters.

What are disclosed by JP-A 4-330444, "Polymer", pp. 242–248, vol. 46, No. 6 (1997) and U.S. Pat. No. 5,627,010 are advantageously used as the above radiation sensitive base generator. However, the radiation sensitive base generator is not limited to these if it generates a base upon exposure to radiation.

The preferred radiation sensitive base generator in the present invention is selected from a photo active carbamate such as triphenyl methanol, benzyl carbamate or benzoin carbamate; amide such as O-carbamoyl hydroxylamide, O-carbamoyloxime, aromatic sulfonamide, alpha-lactam or N-(2-allylethynyl)amide, and other amide; and oxime ester, α-aminoacetophenone and cobalt complex.

Illustrative examples of the radiation sensitive base generator include compounds represented by the following formulas (3) to (13):

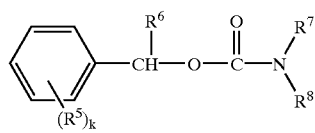
(3)

wherein $R^5$ is an alkyl group having 1 to 6 carbon atoms, alkoxy group having 1 to 6 carbon atoms, thioalkyl group having 1 to 6 carbon atoms, dialkylamino group having 1 to 6 carbon atoms for each alkyl group, piperidyl group, nitro group, hydroxy group, mercapto group, alkenyl group or alkynyl group having 2 to 6 carbon atoms, aryl group having 6 to 20 carbon atoms, fluorine atom, chlorine atom or bromine atom, k is an integer of 0 to 3, $R^6$ is a hydrogen atom, alkyl group having 1 to 6 carbon atoms, alkenyl group or alkynyl group having 2 to 6 carbon atoms, or aryl group having 6 to 20 carbon atoms, and $R^7$ and $R^8$ are each independently a hydrogen atom, alkyl group having 1 to 6 carbon atoms, alkenyl group or alkynyl group having 2 to 6 carbon atoms, aryl group having 6 to 20 carbon atoms or benzyl group, or $R^7$ and $R^8$ may be bonded together to form a cyclic structure having 5 to 6 carbon atoms together with a nitrogen atom bonded thereto,

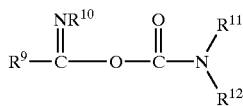
(4)

wherein $R^9$ is an alkyl group having 1 to 6 carbon atoms, alkoxy group having 1 to 6 carbon atoms, thioalkyl group having 1 to 6 carbon atoms, dialkylamino group having 1 to 6 carbon atoms for each alkyl group, piperidyl group, nitro group, hydroxy group, mercapto group, alkenyl group or alkynyl group having 2 to 6 carbon atoms, or aryl group having 6 to 20 carbon atoms, $R^{10}$ is a hydrogen atom, alkyl group having 1 to 6 carbon atoms, alkenyl group or alkynyl group having 2 to 6 carbon atoms, or aryl group having 6 to 20 carbon atoms, and $R^{11}$ and $R^{12}$ are each independently a hydrogen atom, alkyl group having 1 to 6 carbon atoms, alkenyl group or alkynyl group having 2 to 6 carbon atoms, aryl group having 6 to 20 carbon atoms or benzyl group, or $R^{11}$ and $R^{12}$ may be bonded together to form a cyclic structure having 5 to 6 carbon atoms together with a nitrogen atom bonded thereto,

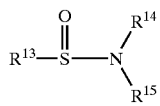
(5)

wherein $R^{13}$ is an alkyl group having 1 to 6 carbon atoms, alkenyl group or alkynyl group having 2 to 6 carbon atoms, or aryl group having 6 to 20 carbon atoms, and $R^{14}$ and $R^{15}$ are each independently a hydrogen atom, alkyl group having 1 to 6 carbon atoms, alkenyl group or alkynyl group having 2 to 6 carbon atoms, aryl group having 6 to 20 carbon atoms or benzyl group, or $R^{14}$ and $R^{15}$ may be bonded together to form a cyclic structure having 5 to 6 carbon atoms together with a nitrogen atom bonded thereto,

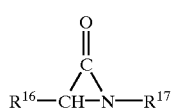
(6)

wherein $R^{16}$ and $R^{17}$ are each independently an alkyl group having 1 to 6 carbon atoms, alkenyl group or alkynyl group having 2 to 6 carbon atoms, or aryl group having 6 to 20 carbon atoms,

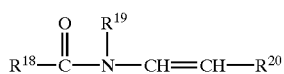
(7)

wherein $R^{18}$, $R^{19}$ and $R^{20}$ are each independently an alkyl group having 1 to 6 carbon atoms, alkenyl group or alkynyl group having 2 to 6 carbon atoms, or aryl group having 6 to 20 carbon atoms,

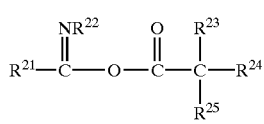
(8)

wherein $R^{21}$ is an alkyl group having 1 to 6 carbon atoms, alkoxy group having 1 to 6 carbon atoms, thioalkyl group having 1 to 6 carbon atoms, dialkylamino group having 1 to 6 carbon atoms for each alkyl group, piperidyl group, nitro group, hydroxy group, mercapto group, alkenyl group or alkynyl group having 2 to 6 carbon atoms, or aryl group having 6 to 20 carbon atoms, $R^{22}$ is a hydrogen atom, alkyl group having 1 to 6 carbon atoms, alkenyl group or alkynyl group having 2 to 6 carbon atoms, or aryl group having 6 to 20 carbon atoms, and $R^{23}$, $R^{24}$ and $R^{25}$ are each independently a hydrogen atom, alkyl group having 1 to 6 carbon atoms, alkenyl group or alkynyl group having 2 to 6 carbon atoms, aryl group having 6 to 20 carbon atoms or benzyl group,

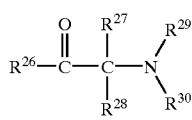
(9)

wherein $R^{26}$ is an alkyl group having 1 to 6 carbon atoms, alkoxy group having 1 to 6 carbon atoms, thioalkyl group having 1 to 6 carbon atoms, dialkylamino group having 1 to 6 carbon atoms for each alkyl group, piperidyl group, nitro group, hydroxy group, mercapto group, alkenyl group or alkynyl group having 2 to 6 carbon atoms, or aryl group having 6 to 20 carbon atoms, $R^{27}$ and $R^{28}$ are each independently a hydrogen atom, hydroxyl group, mercapto group, cyano group, phenoxy group, alkyl group having 1 to 6 carbon atoms, fluorine atom, chlorine atom, bromine atom, alkenyl group or alkynyl group having 2 to 6 carbon atoms, or aryl group having 6 to 20 carbon atoms, and $R^{29}$ and $R^{30}$ are each independently a hydrogen atom, alkyl group having 1 to 6 carbon atoms, alkenyl group or alkynyl group having 2 to 6 carbon atoms, aryl group having 6 to 20 carbon atoms or benzyl group, or $R^{29}$ and $R^{30}$ may be bonded together to form a cyclic structure having 5 to 6 carbon atoms together with a nitrogen atom bonded thereto,

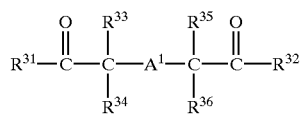

(10)

wherein $R^{31}$ and $R^{32}$ are each independently an alkyl group having 1 to 6 carbon atoms, alkoxy group having 1 to 6 carbon atoms, thioalkyl group having 1 to 6 carbon atoms, dialkylamino group having 1 to 6 carbon atoms for each alkyl group, piperidyl group, nitro group, hydroxy group, mercapto group, alkenyl group or alkynyl group having 2 to 6 carbon atoms, or aryl group having 6 to 20 carbon atoms, $R^{33}$ to $R^{36}$ are each independently a hydrogen atom, hydroxyl group, mercapto group, cyano group, phenoxy group, alkyl group having 1 to 6 carbon atoms, fluorine atom, chlorine atom, bromine atom, alkenyl group or alkynyl group having 2 to 6 carbon atoms, or aryl group having 6 to 20 carbon atoms, and $A^1$ is a divalent atomic group formed by excluding two hydrogen atoms bonded to one or two nitrogen atoms of a monoalkylamine, piperazine, aromatic diamine or aliphatic diamine,

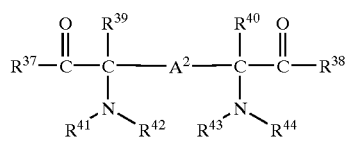

(11)

wherein $R^{37}$ and $R^{38}$ are each independently an alkyl group having 1 to 6 carbon atoms, alkoxy group having 1 to 6 carbon atoms, thioalkyl group having 1 to 6 carbon atoms, dialkylamino group having 1 to 6 carbon atoms for each alkyl group, piperidyl group, nitro group, hydroxy group, mercapto group, alkenyl group or alkynyl group having 2 to 6 carbon atoms, or aryl group having 6 to 20 carbon atoms, $R^{39}$ and $R^{40}$ are each independently a hydrogen atom, hydroxyl group, mercapto group, cyano group, phenoxy group, alkyl group having 1 to 6 carbon atoms, fluorine atom, chlorine atom, bromine atom, alkenyl group or alkynyl group having 2 to 6 carbon atoms, or aryl group having 6 to 20 carbon atoms, $R^{41}$ to $R^{44}$ are each independently a hydrogen atom, alkyl group having 1 to 6 carbon atoms, alkenyl group or alkynyl group having 2 to 6 carbon atoms, aryl group having 6 to 20 carbon atoms or benzyl group, or $R^{41}$ and $R^{42}$, and $R^{43}$ and $R^{44}$ may be bonded together to form a cyclic structure having 5 to 6 carbon atoms together with nitrogen atoms bonded thereto, and $A^2$ is an alkylene group having 1 to 6 carbon atoms, cyclohexylene group, phenylene group or single bond,

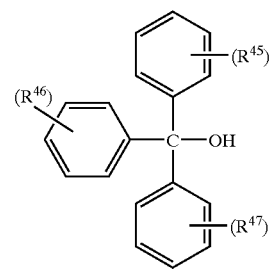

(12)

wherein $R^{45}$ to $R^{47}$ are each independently a hydrogen atom, fluorine atom, chlorine atom, bromine atom, alkyl group having 1 to 6 carbon atoms, alkoxy group having 1 to 6 carbon atoms, alkenyl group or alkynyl group having 2 to 6 carbon atoms, or aryl group having 6 to 20 carbon atoms, $$L_mCO^{3+}.3[(R^{48})_3R^{49}]^- \quad (13)$$

wherein L is at least one ligand selected from the group consisting of ammonia, pyridine, imidazole, ethylenediamine, trimethylenediamine, tetramethylenediamine, hexamethylenediamine, propylenediamine, 1,2-cyclohexanediamine, N,N-diethylethylenediamine and diethylenetriamine, m is an integer of 2 to 6, $R^{48}$ is an alkenyl group or alkynyl group having 2 to 6 carbon atoms, or aryl group having 6 to 20 carbon atoms, and $R^{49}$ is an alkyl group having 1 to 18 carbon atoms.

In all the above formulas (3) to (13), the alkyl group may be linear, branched or cyclic. Examples of the alkenyl group include vinyl group and propylenyl group, examples of the alkynyl group include acetylenyl group, and examples of the aryl group include phenyl group, naphthyl group and anthracenyl group. What contain a fluorine atom, chlorine atom, bromine atom, haloalkyl group, hydroxyl group, carboxyl group, mercapto group, cyano group, nitro group, azido group, dialkylamino group, alkoxy group or thioalkyl group substituted for the hydrogen atoms of the above groups are also included.

Out of these radiation sensitive base generators, preferred are 2-nitrobenzylcyclohexyl carbamate, triphenyl methanol, o-carbamoylhydroxylamide, o-carbamoyloxime, [[(2,6-dinitrobenzyl)oxy]carbonyl]cyclohexylamine, bis[[(2-nitrobenzyl)oxy]carbonyl]hexane 1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexaamminecobalt(III) tris(triphenylmethylborate) and 2-benzyl-2-dimethylamino-1-(4-morpholinophenyl)-butanone.

Examples of the above radiation sensitive radical generator include α-diketones such as benzyl and diacetyl; acyloins such as benzoin; acyloin ethers such as benzoin methyl ether, benzoin ethyl ether and benzoin isopropyl ether; benzophenones such as thioxanthone, 2,4-diethylthioxanthone, thioxanthone-4-sulfonic acid, benzophenone, 4,4'-bis(dimethylamino)benzophenone and 4,4'-bis(diethylamino)benzophenone; acetophenones such as acetophenone, p-dimethylaminoacetophenone, α,α'-dimethoxyacetoxybenzophenone, 2,2'-dimethoxy-2-phenylacetophenone, p-methoxyacetophenone, 2-methyl[4-(methylthio)phenyl]-2-morpholino-1-propanone and 2-benzyl-2-dimethylamino-1-(4-morpholinophenyl)-butane-1-one; quinones such as anthraquinone and 1,4- naphthoquinone; halogen compounds such as phenacyl chloride, tribromomethylphenyl sulfone and tris(trichloromethyl)-s-triazine; acylphosphine oxides such as 2,4,6-trimethylbenzoyldiphenylphosphine oxide, bis(2,6-dimethoxybenzoyl)-2,4,4-trimethyl-pentylphosphine oxide and bis(2,4,6-trimethylbenzoyl)phenylphosphine oxide; and peroxides such as di-t-butyl peroxide.

Commercially available products of these radiation sensitive radical polymerization initiators include IRGACURE-184, 369, 500, 651, 907, 1700, 819, 1000, 2959, 149, 1800 and 1850, Darocur-1173, 1116, 2959, 1664 and 4043 (of Ciba Specialty Chemicals Co., Ltd.), KAYACURE-DETX, MBP, DMBI, EPA and OA (of Nippon Kayaku Co., Ltd.), VICURE-10 and 55 (of STAUFFER Co., Ltd.), TRIGONALP1 (of AKZO Co., Ltd.), SANDORAY 1000 (of SANDOZ Co., Ltd.), DEAP (of APJOHN Co., Ltd.) and QUANTACURE-PDO, ITX and EPD (of WARD BLEKINSOP Co., Ltd.).

A radiation sensitive resin composition having high sensitivity can be obtained by using one of the above radiation sensitive radical polymerization initiators in conjunction with a radiation sensitive sensitizer.

The above radiation sensitive polymerization initiator (C) is used in an amount of preferably 0.01 part or more by weight, more preferably 0.05 part or more by weight based on 100 parts by weight of the total of the polymerizable compound (A) and the non-polymerizable compound (B) when the radiation sensitive polymerization initiator (C) is a radiation sensitive acid generator or base generator. When the amount of the component (C) is smaller than 0.01 part by weight, sensitivity to radiation tends to lower. The upper limit value is preferably 30 parts by weight, more preferably 20 parts by weight.

The radiation sensitive radical generator is contained in an amount of preferably 1 to 50 parts by weight, more preferably 5 to 30 parts by weight based on 100 parts by weight of the total of the polymerizable compound (A) and the non-polymerizable compound (B). When the amount of the radiation sensitive radical generator (C) is smaller than 1 part by weight, sensitivity to radiation tends to lower.

Other Components

The refractive index changing composition used in the present invention may contain other additives in limits not prejudicial to the object of the present invention. The additives include an ultraviolet light absorber, sensitizer, surfactant, heat resistance improving agent and adhesive aid.

The above ultraviolet light absorber is selected from a benzotriazole, salicylate, benzophenone, substituted acrylonitrile, xanthene, coumarin, flavone and chalcone. Specific examples of the ultraviolet light absorber include Tinubin 234 (2-(2-hydroxy-3,5-bis (α,α-dimethylbenzyl)phenyl)-2H-benzotriazole), Tinubin 571 (hydroxyphenylbenzotriazole derivative) and Tinubin 1130 (condensate of methyl-3-(3-t-butyl-5-(2H-benzotriazol-2-yl)-4-hydroxyphenyl)propionate and polyethylene glycol (molecular weight of 300)) (of Ciba Specialty Chemicals Co., Ltd.), 1,7-bis(4-hydroxy-3-methoxyphenyl)-1,6-heptadien-3,5-dione, and dibenzylidene acetone.

By adding an ultraviolet light absorber, the amount of an acid, base or radical formed from the component (C) can be made gradually smaller as the depth from the surface of an exposed portion of the refractive index changing composition of the present invention increases, which is useful as means of forming GRIN. The amount of the ultraviolet light absorber is preferably 30 parts or less by weight, more preferably 20 parts or less by weight based on 100 parts by weight of the total of the components (A) and (B).

The above sensitizer is selected from a coumarin having a substituent at the 3-position and/or 7-position, flavone, dibenzalacetone, dibenzalcyclohexane, chalcone, xanthene, thioxanthene, porphyrin, phthalocyanine, acridine and anthracene.

The amount of the sensitizer is preferably 30 parts or less by weight, more preferably 20 parts or less by weight based on 100 parts by weight of the total of the components (A) and (B).

The above surfactant may be added to improve coatability, for example, prevent striation, and improve developability.

Examples of the surfactant include nonionic surfactants such as polyoxyethylene alkyl ethers including polyoxyethylene lauryl ether, polyoxyethylene stearyl ether and polyoxyethylene oleyl ether, polyoxyethylene aryl ethers including polyoxyethylene octylphenyl ether and polyoxyethylene nonylphenyl ether, and polyethylene glycol dialkyl esters including polyethylene glycol dilaurate and polyethylene glycol distearate; fluoro-based surfactants commercially available under the trade names of F Top EF301, EF303 and EF352 (of Shin Akita Kasei Co., Ltd.), Megafac F171, F172 and F173 (of Dainippon Ink and Chemicals, Inc.), Florade FC430 and FC431 (of Sumitomo 3M Limited), and Asahi Guard AG710, Surflon S-382, SC-101, SC-102, SC-103, SC-104, SC-105 and SC-106 (of Asahi Glass Co., Ltd.); and other surfactants commercially available under the trade names of organosiloxane polymer KP341 (of Shin-Etsu Chemical Co., Ltd.) and acrylic or methacrylic acid-based (co)polymer Polyflow No. 57 and No. 95 (of Kyoeisha Kagaku Co., Ltd.).

The amount of the surfactant is preferably 2 parts or less by weight, more preferably 1 part or less by weight based on 100 parts by weight of the total of the components (A) and (B).

The above adhesive aid may be added to improve adhesion to a substrate and is preferably a silane coupling agent.

The above heat resistance improving agent is an unsaturated compound such as a polyvalent acrylate.

An antistatic agent, keeping stabilizer, halation inhibitor, anti-foaming agent, pigment and thermal acid generator may be further added to the refractive index changing material used in the present invention, as required.

Formation of Refractive Index Pattern

In the present invention, a refractive index pattern can be formed from the above refractive index changing composition as follows, for example.

First, the refractive index changing composition is dissolved or dispersed in a solvent to prepare a composition having a solid content of 5 to 70 wt %. The composition may be filtered with a filter having a pore diameter of about 0.1 to 10 μm before use, as required.

Thereafter, this composition is applied to the surface of a substrate such as a silicon wafer and prebaked to remove the solvent so as to form the coating film of the refractive index changing composition. Part of the formed coating film is then exposed to radiation through a pattern mask and heated to produce a refractive index difference between exposed and unexposed portions of the refractive index changing composition.

An acid, base or radical is formed from the radiation sensitive polymerization initiator (C) by the above exposure to start the polymerization or reaction of the component (A). This component (A) of the unexposed portion dissipates at the time of heating after exposure. As a result, there is produced a difference in refractive index between exposed and unexposed portions.

The solvent used to prepare a solution containing the refractive index changing composition used in the present invention uniformly dissolves the above components (A), (B) and (C) and other optionally added additives and does not react with these components.

Illustrative examples of the solvent include alcohols such as methanol, ethanol, propanol, iso-propanol, butanol, ethylene glycol and propylene glycol; ethers such as tetrahydrofuran; glycol ethers such as ethylene glycol monomethyl ether and ethylene glycol monoethyl ether; ethylene glycol alkylether acetates such as methyl cellosolve acetate and ethyl cellosolve acetate; diethylene glycols such as diethylene glycol monomethyl ether, diethylene glycol monoethyl ether, diethylene glycol dimethyl ether and diethylene glycol ethyl methyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate; and fluorine atom-containing solvents such as trifluoromethylbenzene, 1,3-bis(trifluoromethyl) benzene, hexafluorobenzene, hexafluorocyclohexane, perfluorodimethylcyclohexane, perfluoromethylcyclohexane, octafluorodecalin and 1,1,2-trichloro-1,2,2-trifluoroethane.

Out of these solvents, alcohols, glycol ethers, ethylene glycol alkyl ether acetates, propylene glycol alkyl ether acetates, ketones, esters and diethylene glycols are preferred from the viewpoints of solubility, reactivity with each component and ease of forming a coating film.

Further, a high-boiling solvent may be used in combination with the above solvent. Examples of the high-boiling solvent include N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate.

The refractive index changing composition used in the present invention is formed into various shapes in consideration of application purpose before exposure to radiation. For example, it is formed like a rod, fiber, long board, sphere, film or lens and the present invention is not limited to these. A commonly used molding technique may be used, as exemplified by injection molding, compression molding, blow molding, extrusion, in-case frame polymerization, shaving, drawing, heating/cooling, CVD deposition, sintering and scanning. Spin coating, slitting, bar coating, solvent casting, LB, spraying, roll coating, relief-printing or screen printing may also be used according to the application purpose of an optically molded product.

In this molding process, heating (to be referred to as "prebaking" hereinafter) is preferably carried out. The heating condition which changes according to the composition of the material of the present invention and the type of each additive is preferably 30 to 200° C., more preferably 40 to 150° C. A hot plate or oven, or infrared radiation may be used for heating.

The radiation used for exposure is an i-line having a wavelength of 365 nm, h-line having a wavelength of 404 nm, g-line having a wavelength of 436 nm, ultraviolet radiation from a wide-range wavelength light source such as a xenon lamp, far ultraviolet radiation such as KrF excimer laser beam having a wavelength of 248 nm or ArF excimer laser beam having a wavelength of 193 nm, X-radiation such as synchrotron radiation, charged corpuscular beam such as electron beam, visible radiation or a mixture thereof. Out of these, ultraviolet radiation and visible radiation are preferred. The illuminance which depends on the wavelength of the radiation is preferably 0.1 to 100 mW/cm$^2$ because the highest reaction efficiency is obtained. The projection of the radiation through a pattern mask makes possible the patterning of the radiation sensitive refractive index changing material. As for patterning accuracy which is affected by a light source used, an optical part having a refractive index variation distribution with a resolution of about 0.2 μm can be produced.

In the present invention, heating (post-exposure baking (PEB)) is preferably carried out after exposure. A similar device to the above prebaking device may be used for PEB and PEB conditions may be arbitrary. The heating temperature is preferably 30 to 150° C., more preferably 30 to 130° C. If the component (A) of the unexposed portion is not dissipated completely by heating under normal pressure, heating under reduced pressure may be carried out. A refractive index pattern can be thereby formed effectively.

Re-exposure may be further carried out to decompose the residual component (C) existent in the unexposed portion and further improve the stability of the material.

The re-exposure may be carried out, for example, by projecting radiation having the same wavelength as that of the radiation used to change the refractive index onto the entire surface of the pattern in the same amount.

Optionally, the stability of the material may be further improved by heating. A similar device to the prebaking device used at the time of molding the material may be used for heating and the heating conditions may be arbitrary.

According to the present invention, the refractive index pattern forming method of the present invention may also be carried out by exposing a refractive index changing composition comprising the above components (A), (B) and (C) to radiation through a pattern mask and treating it with a developer.

As for the type of the above developer, a developer which dissolves the component (A) and an optionally added catalyst and does not dissolve a polymer formed from the component (A) and the component (B) is preferred. When this developer is selected, the surface of the obtained refractive index pattern is not roughened.

The developer is an alkaline aqueous solution comprising an inorganic alkali such as sodium hydroxide, potassium hydroxide, sodium carbonate, sodium silicate, sodium metasilicate or ammonia water; primary amine such as ethylamine or n-propylamine; secondary amine such as diethylamine or di-n-propylamine; tertiary amine such as triethylamine, methyldiethylamine or N-methylpyrrolidone; alcohol amine such as dimethylethanolamine or triethanolamine; quaternary ammonium salt such as tetramethylammonium hydroxide, tetraethylammonium hydroxide or choline; or cyclic amine such as pyrrole, piperidine, 1,8-diazabicyclo[5.4.0]-7-undecene or 1,5-diazabicyclo[4.3.0]-5-nonane. An organic solvent selected from an alcohol such as methanol, ethanol, iso-propanol, n-propanol, n-butanol, iso-butanol, tert-butanol, cyclohexanol, ethylene glycol, propylene glycol or diethylene glycol; ether such as diethyl ether or tetrahydrofuran; glycol ether such as ethylene glycol monomethyl ether or ethylene glycol monoethyl ether; ethylene glycol alkyl ether acetate such as methyl cellosolve acetate or ethyl cellosolve acetate; diethylene glycol such as diethylene glycol monomethyl ether, diethylene glycol monoethyl ether or diethylene glycol dimethyl ether; propylene glycol monoalkyl ether such as propylene glycol methyl ether or propylene glycol ethyl ether; propylene glycol alkyl ether acetate such as propylene glycol methyl ether acetate or propylene glycol ethyl ether acetate; propylene glycol alkyl ether propionate such as propylene glycol methyl ether propionate, propylene glycol ethyl ether propionate, propylene glycol propyl ether propionate or propylene glycol butyl ether propionate; aromatic hydrocarbon such as toluene or xylene; aliphatic hydrocarbon such as n-hexane, n-heptane or n-octane; ketone such as methyl ethyl ketone, cyclohexanone, methyl isobutyl ketone, methylamyl ketone or 4-hydroxy-4-methyl-2-pentanone; or ester such as ethyl acetate, propyl acetate, butyl acetate, ethyl 2-hydroxypropionate, methyl 2-hydroxy-2-methylpropionate, ethyl hydroxyacetate, butyl hydroxyacetate, ethyl lactate, propyl lactate, butyl lactate, methyl 3-hydroxypropionate, methyl 2-hydroxy-3-methylbutanoate, ethyl methoxyacetate, butyl methoxyacetate, ethyl 2-methoxypropionate, butyl 2-methoxypropionate, butyl 2-ethoxypropionate, butyl 2-butoxypropionate, butyl 3-methoxypropionate, butyl 3-ethoxypropionate, butyl 3-propoxypropionate or butyl 3-butoxypropionate may also be used as the developer.

Out of these, water, alcohols, glycol ethers and ethylene glycol alkyl ether acetates are preferably used.

The development time is generally 30 to 180 seconds, and puddle development or dipping development may be used. After development, the coating film is rinsed with running water for 30 to 90 seconds and dried with compressed air or compressed nitrogen to remove water on the substrate, thereby forming a refractive index pattern.

Further, re-exposure may be carried out to decompose the residual component (C) existent in the unexposed portion and further improve the stability of the material.

As for what is not described of the refractive index pattern forming method including the above stabilization, it should be understood that the above description of the refractive index pattern forming method is applied directly or with modifications obvious to people having ordinary skill in the art.

The residual polymerizable compound (A) existent in the unexposed portion is removed by the above heating to preferably form pores.

In the refractive index pattern of the present invention formed by any one of the above various methods, the refractive index of the exposed portion (first region) is preferably larger than that of the unexposed portion (second region). This difference can be adjusted to a desired value by controlling the types and contents of the components (A) and (B) in the refractive index changing composition used in the present invention. For example, the largest value of refractive index difference can be set to a value larger than 0.02.

The refractive index pattern of the present invention has pores or does not have any pores in the unexposed portion.

When the unexposed portion has pores, its porosity is preferably 10 to 99.9%, more preferably 15 to 99.9%, particularly preferably 20 to 99.9%.

Since the refractive index pattern of the present invention does not deteriorate without a change in refractive index even when it is used under the condition that light having a wavelength close to the wavelength used to change the refractive index passes therethrough as described above, it is extremely useful as an optical material for use in optoelectronic and display fields.

As the refractive index pattern of the present invention has a sufficiently large refractive index difference and the produced refractive index difference is stable to light and heat, it is extremely useful as an optical material for use in optoelectronic and display fields. The refractive index pattern of the present invention may also be used in optical parts such as photoarrays, lenses, photocouplers, photointerruptors, polarization beam splitters, holograms, single-mode and multi-mode optical fibers, bundle fibers, light guides, single-core, multi-core and photoelectric coupling optical connectors, optical isolators, polarizers, optical sensors such as photodiodes, phototransistors, photo-ICs, CCD image sensors, CMOS image sensors, optical fiber sensors and optical fiber gyros, optical disks such as CD, LD, PD and DVD, optical switches, waveguides, optical touch panels, diffraction gratings, optical guide plates, optical diffusers, anti-reflectors and optical sealers.

Method of Producing Optical Parts

The radiation sensitive refractive index changing composition is formed into various shapes in consideration of application purpose before exposure to radiation.

For example, it is formed like a rod, fiber, long board, sphere, film or lens and the present invention is not limited to these. A commonly used molding technique may be used, as exemplified by injection molding, compression molding, blow molding, extrusion, in-case frame polymerization, shaving, drawing, heating/cooling, CVD deposition, sintering and scanning. Spin coating, slitting, bar coating, solvent casting, LB, spraying, roll coating, relief-printing or screen printing may also be used according to the application purpose of an optically molded product.

The radiation used for exposure is an i-line having a wavelength of 365 nm, h-line having a wavelength of 404 nm, g-line having a wavelength of 436 nm, ultraviolet radiation from a wide-range wavelength light source such as a xenon lamp, far ultraviolet radiation such as KrF excimer laser beam having a wavelength of 248 nm or ArF excimer laser beam having a wavelength of 193 nm, X-radiation such as synchrotron radiation, charged corpuscular beam such as electron beam, visible radiation or a mixture thereof. Out of these, ultraviolet radiation and visible radiation are preferred. The illuminance which depends on the wavelength of the radiation is preferably 0.1 to 100 mW/cm$^2$ because the highest reaction efficiency is obtained. The projection of the radiation through a pattern mask makes possible the patterning of the radiation sensitive refractive index changing composition. As for patterning accuracy which is affected by a light source used, an optical part having a refractive index variation distribution with a resolution of about 0.2 μm can be produced.

In the present invention, post-exposure baking (PEB) is preferably carried out. The heating condition which changes according to the composition of the material of the present invention and the type of each additive is preferably 30 to 200° C., more preferably 40 to 150° C. A hot plate or oven, or infrared radiation maybe used for heating. The component (A) in the unexposed portion can be removed by heating under reduced pressure or using a developer as described above.

The difference between the maximum refractive index and the minimum refractive index in the refractive index distribution of an optical part of the present invention can be set to a desired value according to application purpose as described above. For example, it can be set to 0.02 or more, optionally 0.03 or more, 0.05 or more, or 0.08 or more.

EXAMPLES

The following examples are provided for the purpose of further illustrating the present invention but are in no way to be taken as limiting.

The weight average molecular weight in terms of polystyrene of a polymer was measured using the GPC CHROMATOGRAPH SYSTEM-21 of Showa Denko K.K.

SYNTHESIS EXAMPLES OF COMPONENT (B)

Synthesis Example 1

15.22 g of tetramethoxysilane and 27.24 g of methyltrimethoxysilane were dissolved in 100 g of ethylene glycol ethyl methyl ether in a 1-liter three-necked flask and the obtained mixed solution was heated at 60° C. under agitation with a magnetic stirrer. 5.20 g of ion exchange water was continuously added to the mixed solution in 1 hour. After 4 hours of a reaction at 60° C., the obtained reaction solution was cooled to room temperature. Thereafter, 9.20 g of methanol which was a reaction by-product was distilled off under reduced pressure from the reaction solution. The solid content of the solution of the obtained polymer (B-1) was 33.2% and the weight average molecular weight of the polymer was 2,200.

Synthesis Example 2

After the inside of a 1.5-liter stainless steel autoclave equipped with an electromagnetic stirrer was fully substituted by nitrogen gas, 500 g of ethyl acetate, 57.2 g of ethyl vinyl ether (EVE), 10.2 g of hydroxybutyl vinyl ether (HBVE) and 3 g of lauroyl peroxide were fed to the autoclave and cooled to −50° C. with dry ice and methanol, and oxygen within the system was removed with nitrogen gas again. 146 g of hexafluoropropylene (HFP) was then fed and the temperature began to be elevated. The pressure when the inside temperature of the autoclave reached 60° C. was 5.3 kgf/cm$^2$. Thereafter, the reaction was continued at 60° C. for 20 hours under agitation and the autoclave was cooled with water when the pressure dropped to 1.5 kgf/cm$^2$ to stop the reaction. After the temperature reached room temperature, unreacted monomers were discharged and the autoclave was opened to obtain a polymer solution having a solid content of 28.1%. The obtained polymer solution was injected into methanol to precipitate a polymer which was then washed with methanol and vacuum dried at 50° C. to obtain 193 g of a fluorine-containing copolymer. The weight average molecular weight of the obtained polymer (B-2) was 17,000.

Synthesis Example 3

8 g of 2,2'-azobis(2,4-dimethylvaleronitrile) and 200 g of diethylene glycol dimethyl ether were fed to a 500-ml three-necked flask. Subsequently, 20 g of methacrylic acid, 30 g of glycidyl methacrylate and 50 g of pentafluoroethyl methacrylate were fed to the flask, the inside of the flask was substituted with nitrogen, and stirring was started gently. The temperature of the solution was elevated to 70° C. and maintained at that temperature for 3 hours to obtain a solution of a polymer (B-3). The solid content of the obtained polymer solution was 31.0% and the weight average molecular weight of the polymer was 12,000.

Synthesis Example 4

50 g of methyltrimethoxysilane was fed to a 1-liter three-necked flask, 100 g of 1-ethoxy-2-propanol was added and dissolved in the methyltrimethoxysilane, and the obtained mixed solution was heated at 60° C. under agitation with a magnetic stirrer. 19.85 g of ion exchange water was continuously added to this in 1 hour. After 4 hours of a reaction at 60° C., the obtained reaction solution was cooled to room temperature.

Thereafter, methanol which was a reaction by-product was distilled off under reduced pressure from the reaction solution, and then the reaction solution was concentrated to a solid content of 20 wt % to obtain a solution containing a compound (B-4). The weight average molecular weight of the compound (B-4) was 8,000.

Example 1

40 parts by weight of divinylbenzene as the component (A), 60 parts by weight of a co-condensate (molecular weight of 2,000) of a mixture of methyltrimethoxysilane and tetramethoxysilane (weight ratio of 55:5) as the component (B) and 3 parts by weight of 2-(4-methoxyphenyl)-4,6-bis(trichloromethyl)-s-triazine as the component (C) were dissolved in diethylene glycol ethyl methyl ether to a total solids content of 20 wt %, and the resulting solution was filtered with a membrane filter having a pore diameter of 0.2 μm to prepare a solution containing a radiation sensitive refractive index changing composition.

Formation of a Coating Film

The above solution was applied to a silicon substrate with a spinner and prebaked on a hot plate at 90° C. for 2 minutes to form a 1.0 μm thick coating film.

Formation of a Refractive Index Pattern

The obtained coating film was exposed to 70 mJ/cm$^2$ of radiation at the optimum focusing depth with the NSR1505i6A reduction projection exposure device (of Nikon Corporation, NA=0.45, λ=365 nm) to produce a refractive index difference between exposed and unexposed portions of the refractive index changing composition. The coating film was then post-exposure baked on a hot plate at 100° C. under a reduced pressure of 0.5 Torr for 2 minutes and further heated in an oven at 200° C. under normal pressure for 10 minutes.

Measurement of Refractive Index

The refractive indices of exposed and unexposed portions on the silicon substrate at room temperature were measured at 633 nm with the Auto EL IV NIR III ellipsometer (of Rudolf Research Co., Ltd.). The results are shown in Table 1.

Evaluation of Transparency

A glass substrate coated with a radiation sensitive refractive index changing composition thereon was obtained in the same manner as described above except that the Corning 1737 (of Corning Co., Ltd.) glass substrate was used in place of the silicon substrate.

Thereafter, the transmittance of the obtained glass substrate was measured at a wavelength of 400 to 800 nm with the 150-20 double beam spectrophotometer (of Hitachi, Ltd.). It can be said that when the minimum transmittance exceeds 95%, the transmittance is satisfactory and when the minimum transmittance is 95% or less, the transmittance is unsatisfactory. The results are shown in Table 1.

Example 2

The procedure of Example 1 was repeated except that the amount of exposure was changed to 250 mJ/cm$^2$ to evaluate refractive index and transparency. The results are shown in Table 1.

Example 3

Evaluations were carried out in the same manner as in Example 1 except that 60 parts by weight of the GR-650 ladder type polysilsesquioxane (of Showa Denko K.K.) was used as the component (B). The results are shown in Table 1.

Example 4

Evaluations were carried out in the same manner as in Example 1 except that 65 parts by weight of divinylbenzene was used as the component (A) and 35 parts by weight of a condensate of methyltrimethoxysilane (molecular weight of 2,000) was used as the component (B). The results are shown in Table 1.

Example 5

50 parts by weight of benzyl methacrylate and 40 parts by weight of bis(4-acryloylthiophenyl)sulfide as the components (A), a solution containing the polymer (B-3) (equivalent to 50 parts by weight (solid content) of the polymer (B-3)) as the component (B), and 25 parts by weight of 2-benzyl-2-dimethylamino-1-(4-morpholinophenyl)-butane-1-one (IRGACURE-369; Ciba Specialty Chemicals Co., Ltd.) as the component (C) were dissolved in diethylene glycol ethyl methyl ether to a total solids content of 20 wt % and the resulting solution was filtered with a membrane filter having a pore diameter of 0.2 μm to prepare a solution containing a radiation sensitive refractive index changing composition. The formation of a coating film, the measurement of refractive index and the evaluation of transparency were carried out in the same manner as in Example 1. The formation of a refractive index pattern was carried out as follows. The results are shown in Table 1.

Formation of a Refractive Index Pattern

The obtained coating film was exposed to 100 mJ/cm$^2$ of radiation at the optimum focusing depth with the NSR1505i6A reduction projection exposure device (of Nikon Corporation, NA=0.45, λ=365 nm) to produce a difference in refractive index between exposed and unexposed portions of the refractive index changing composition. The film was then post-exposure baked on a hot plate at 100° C. under a reduced pressure of 0.5 Torr for 2 minutes, developed with isopropanol at 25° C. for 60 seconds and rinsed with running pure water for 1 minute. Finally, it was heated in an oven at 200° C. for 10 minutes.

Example 6

Evaluations were carried out in the same manner as in Example 5 except that a solution containing the polymer (B-1) (equivalent to 50 parts by weight (solid content) of the polymer (B-1)) was used as the component (B). The results are shown in Table 1.

Example 7

Evaluations were carried out in the same manner as in Example 5 except that 40 parts by weight of benzyl methacrylate, 20 parts by weight of vinyl naphthalene and 40 parts by weight of bis(4-acryloylthiophenyl)sulfide were used as the components (A) and a solution containing the polymer (B-3) (equivalent to 40 parts by weight (solid content) of the polymer (B-3)) was used as the component (B). The results are shown in Table 1.

Example 8

Evaluations were carried out in the same manner as in Example 5 except that 30 parts by weight of 2-methyl-1[4-(methylthio)phenyl]-2-morpholinopropane-1-one (IRGACURE-907; Ciba Specialty Chemicals Co., Ltd.) and 3 parts by weight of 2,4-diethylthioxanthone were used as the components (C) and the amount of exposure for the formation of a refractive index pattern was changed as shown in Table 1. The results are shown in Table 1.

Example 9

60 parts by weight of di(4-vinyloxy)butyl terephthalate and 30 parts by weight of tetrakis(β-epoxypropylthiomethyl)methane as the components (A), a solution containing the polymer (B-4) (equivalent to 40 parts by weight (solid content) of the polymer (B-4)) as the component (B) and 3 parts by weight of 4-phenylthiophenyldiphenylsulfonium trifluoromethane sulfonate as the component (C) were dissolved in diethylene glycol ethyl methyl ether to a total solids content of 20 wt % and the resulting solution was filtered with a membrane filter having a pore diameter of 0.2 μm to prepare a solution containing a radiation sensitive refractive index changing composition. The formation of a coating film, the measurement of refractive index and the evaluation of transparency were carried out in the same manner as in Example 1, and the amount of exposure and the temperature of post-exposure baking for the formation of a refractive index pattern were changed as shown in Table 1. The products of Example 5 except for above was repeated. The results are shown in Table 1.

Example 10

Evaluations were carried out in the same manner as in Example 9 except that a solution containing the polymer (B-2) (equivalent to 40 parts by weight (solid content) of the polymer (B-2)) was used as the component (B). The results are shown in Table 1.

Example 11

Evaluations were carried out in the same manner as in Example 9 except that 1 part by weight of diphenyliodonium trifluoroacetate was used as the component (C) and that the amount of exposure for the formation of a refractive index pattern was changed as shown in Table 1. The results are shown in Table 1.

Example 12

Evaluations were carried out in the same manner as in Example 9 except that 60 parts by weight of di(4-vinyloxy) butyl terephthalate and 30 parts by weight of bis[(3-ethyl-3-oxetanylmethoxy)methyl-phenyl]sulfone were used as the components (A). The results are shown in Table 1.

TABLE 1

| | Refractive index pattern forming conditions | | optical properties | | | |
|---|---|---|---|---|---|---|
| | | | refractive index | | transparency | |
| | Amount of exposure (mJ/cm$^2$) | PEB temperature (° C.) | Exposed portion | unexposed portion | Exposed portion | unexposed portion |
| Ex.1 | 70 | 100 | 1.51 | 1.42 | 98.6% | 98.7% |
| Ex.2 | 250 | 100 | 1.51 | 1.42 | 98.5% | 98.7% |
| Ex.3 | 70 | 100 | 1.51 | 1.42 | 98.8% | 99.1% |
| Ex.4 | 70 | 100 | 1.54 | 1.42 | 98.5% | 99.0% |
| Ex.5 | 100 | 100 | 1.53 | 1.42 | 98.6% | 98.7% |
| Ex.6 | 100 | 100 | 1.53 | 1.42 | 98.6% | 99.0% |
| Ex.7 | 100 | 100 | 1.55 | 1.42 | 98.4% | 99.1% |
| Ex.8 | 140 | 100 | 1.53 | 1.42 | 98.2% | 98.6% |
| Ex.9 | 90 | 130 | 1.50 | 1.42 | 98.5% | 98.9% |
| Ex.10 | 90 | 130 | 1.46 | 1.38 | 98.5% | 99.0% |
| Ex.11 | 120 | 130 | 1.50 | 1.42 | 98.5% | 98.9% |
| Ex.12 | 90 | 130 | 1.48 | 1.42 | 98.9% | 98.9% |

Ex.: Example

What is claimed is:

1. A radiation sensitive refractive index changing composition comprising (A) a polymerizable compound, (B) a non-polymerizable compound having a lower refractive index than the polymer of the polymerizable compound (A), and (C) a radiation sensitive polymerization initiator, said non-polymerizable compound being selected from the group consisting of a polymer obtained by substituting a fluorine atom for the hydrogen atom of a resin which is selected from the ground consisting of acrylic resin, urethane resin, polyester resin, polycarbonate resin, norbornene resin, styrene resin, polyether sulfone resin, silicon resin, polyamide resin, polyimide resin, polysiloxane resin, fluororesin, polybutadiene resin, vinyl ether resin, and vinyl ester resin;

a compound represented by the following formula (1)

$$R^1{}_n Si(OR^2)_{4-n} \quad (1)$$

wherein $R^1$ and $R^2$ may be the same or different and each is a monovalent organic group, and n is an integer of 0 to 2;

a hydrolysate of said compound represented by formula (1);

a condensate of said hydrolysate of said compound represented by formula (1);

a ladder type polysilsesquioxane represented by the following formula (2)

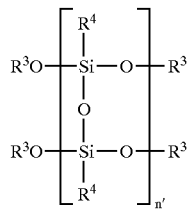

(2)

wherein $R^3$ is a monovalent organic group, $R^4$ is a hydrogen atom or monovalent organic group, $R^3$ and $R^4$ may be the same or different, and n' is a positive integer corresponding to the molecular weight;

a hydrolysate of said ladder type polysilsesquioxane represented by formula (2); and a condensate of said hydrolysate of said ladder type polysilsesquioxane represented by formula (2).

2. The composition of claim 1, wherein the maximum difference in refractive index between exposed and unexposed portions is 0.02 or more.

3. The composition of claim 1 or 2, wherein the relationship between the refractive index $n_B$ of the non-polymerizable compound (B) and the refractive index $n_A$ of the polymer of the polymerizable compound (A) satisfies the following expression (1):

$$n_A - n_B \geq 0.05 \quad (1).$$

4. A method of changing refractive index comprising exposing a radiation sensitive refractive index changing composition of claim 1 to radiation.

5. The method of claim 4, wherein said non-polymerizable compound is a polymer obtained by substituting a fluorine atom for the hydrogen atom of a resin which is selected from the group consisting of acrylic resin, urethane resin, polyester resin, polycarbonate resin, norbornene resin, styrene resin, polyether sulfone resin, silicon resin, polyamide resin, polyimide resin, polysiloxane resin, fluororesin, polybutadiene resin, vinyl ether resin, and vinyl ester resin.

6. The method of claim 4, wherein said non-polymerizable compound is selected from the group consisting of:

a compound represented by formula (1)

$$R^1{}_n Si(OR^2)_{4-n} \quad (1)$$

wherein $R^1$ and $R^2$ may be the same or different and each is a monovalent organic group, and n is an integer of 0 to 2;

a hydrolysate of said compound represented by formula (1); and a condensate of said hydrolysate of said compound represented by formula (1).

7. The method of claim 4, wherein said non-polymerizable compound is selected from the group consisting of a compound represented by formula (2)

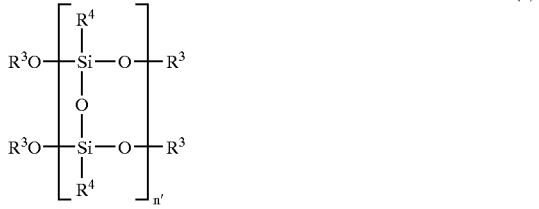

(2)

wherein $R^3$ is a monovalent organic group, $R^4$ is a hydrogen atom or monovalent organic group, $R^3$ and $R^4$ may be the same or different, and n' is a positive integer corresponding to the molecular weight;

a hydrolysate of said compound represented by formula (2); and a condensate of said hydrolysate of said compound represented by formula (2).

8. A method of forming a refractive index pattern comprising exposing a radiation sensitive refractive index changing composition of claim 1 to radiation through a pattern mask.

9. A refractive index pattern formed by the method of claim 8.

10. An optical material having a refractive index pattern formed by the method of claim 8.

11. The optical material of claim 10, wherein said non-polymerizable compound is a polymer obtained by substituting a fluorine atom for the hydrogen atom of a resin which is selected from the group consisting of acrylic resin, urethane resin, polyester resin, polycarbonate resin, norbornene resin, styrene resin, polyether sulfone resin, silicon resin, polyamide resin, polyimide resin, polysiloxane resin, fluororesin, polybutadiene resin, vinyl ether resin, and vinyl ester resin.

12. The optical material of claim 10, wherein said non-polymerizable compound is selected from the group consisting of:

a compound represented by formula (1)

(1)

wherein $R^1$ and $R^2$ may be the same or different and each is a monovalent organic group, and n is an integer of 0 to 2;

a hydrolysate of said compound represented by formula (1); and a condensate of said hydrolysate of said compound represented by formula (1).

13. The optical material of claim 10, wherein said non-polymerizable compound is selected from the group consisting of a compound represented by formula (2)

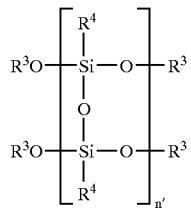

(2)

wherein $R^3$ is a monovalent organic group, $R^4$ is a hydrogen atom or monovalent organic group, $R^3$ and $R^4$ may be the same or different, and n' is a positive integer corresponding to the molecular weight;

a hydrolysate of said compound represented by formula (2); and a condensate of said hydrolysate of said compound represented by formula (2).

14. The method of claim 8, wherein said non-polymerizable compound is a polymer obtained by substituting a fluorine atom for the hydrogen atom of a resin which is selected from the group consisting of acrylic resin, urethane resin, polyester resin, polycarbonate resin, norbornene resin, styrene resin, polyether sulfone resin, silicon resin, polyamide resin, polyimide resin, polysiloxane resin, fluororesin, polybutadiene resin, vinyl ether resin, and vinyl ester resin.

15. The method of claim 8, wherein said non-polymerizable compound is selected from the group consisting of:

a compound represented by formula (1)

(1)

wherein $R^1$ and $R^2$ may be the same or different and each is a monovalent organic group, and n is an integer of 0 to 2;

a hydrolysate of said compound represented by formula (1); and a condensate of said hydrolysate of said compound represented by formula (1).

16. The method of claim 8, wherein said non-polymerizable compound is selected from the group consisting of a compound represented by formula (2)

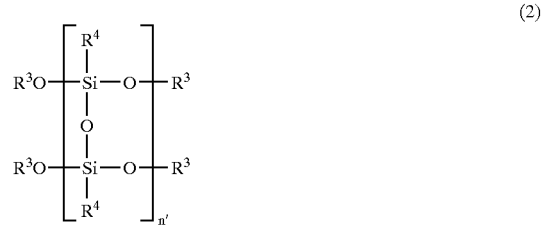

(2)

wherein $R^3$ is a monovalent organic group, $R^4$ is a hydrogen atom or monovalent organic group, $R^3$ and $R^4$ may be the same or different, and n' is a positive integer corresponding to the molecular weight;

a hydrolysate of said compound represented by formula (2); and a condensate of said hydrolysate of said compound represented by formula (2).

17. The composition of claim 1, wherein said non-polymerizable compound is a polymer obtained by substituting a fluorine atom for the hydrogen atom of a resin which is selected from the group consisting of acrylic resin, urethane resin, polyester resin, polycarbonate resin, norbornene resin, styrene resin, polyether sulfone resin, silicon resin, polyamide resin, polyimide resin, polysiloxane resin, fluororesin, polybutadiene resin, vinyl ether resin, and vinyl ester resin.

18. The composition of claim 1, wherein said non-polymerizable compound is selected from the group consisting of:

a compound represented by formula (1)

(1)

wherein $R^1$ and $R^2$ may be the same or different and each is a monovalent organic group, and n is an integer of 0 to 2;

a hydrolysate of said compound represented by formula (1); and a condensate of said hydrolysate of said compound represented by formula (1).

19. The composition of claim 1, wherein said non-polymerizable compound is selected from the group consisting of a compound represented by formula (2)

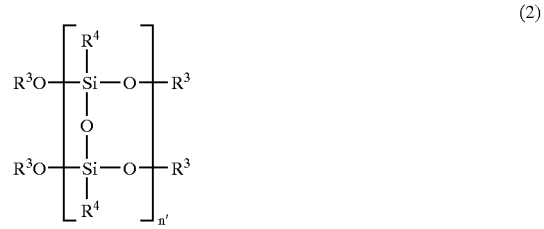

(2)

wherein $R^3$ is a monovalent organic group, $R^4$ is a hydrogen atom or monovalent organic group, $R^3$ and $R^4$ may be the same or different, and n' is a positive integer corresponding to the molecular weight;

a hydrolysate of said compound represented by formula (2); and a condensate of said hydrolysate of said compound represented by formula (2).

* * * * *